(12) United States Patent
Nakamura et al.

(10) Patent No.: US 11,805,674 B2
(45) Date of Patent: Oct. 31, 2023

(54) DISPLAY PANEL AND DISPLAY DEVICE INCLUDING PARTITION WALL

(71) Applicant: SEMICONDUCTOR ENERGY LABORATORY CO., LTD., Atsugi (JP)

(72) Inventors: Daiki Nakamura, Kanagawa (JP); Nozomu Sugisawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/705,464

(22) Filed: Mar. 28, 2022

(65) Prior Publication Data
US 2022/0216449 A1 Jul. 7, 2022

Related U.S. Application Data

(62) Division of application No. 16/637,801, filed as application No. PCT/IB2018/055989 on Aug. 9, 2018, now Pat. No. 11,302,898.

(30) Foreign Application Priority Data

Aug. 25, 2017 (JP) ................................. 2017-162045

(51) Int. Cl.
*H10K 50/85* (2023.01)
*H10K 50/86* (2023.01)
(Continued)

(52) U.S. Cl.
CPC ......... *H10K 50/856* (2023.02); *H10K 50/828* (2023.02); *H10K 50/844* (2023.02);
(Continued)

(58) Field of Classification Search
CPC ............. H01L 51/5271; H01L 51/5234; H01L 51/5253; H01L 51/5218; H01L 51/5225;
(Continued)

(56) References Cited

U.S. PATENT DOCUMENTS

| 5,703,436 A | 12/1997 | Forrest et al. |
| 5,707,745 A | 1/1998 | Forrest et al. |

(Continued)

FOREIGN PATENT DOCUMENTS

| CN | 101308781 A | 11/2008 |
| CN | 102844806 A | 12/2012 |

(Continued)

OTHER PUBLICATIONS

International Search Report (Application No. PCT/IB2018/055989) dated Nov. 6, 2018.

(Continued)

*Primary Examiner* — Ida M Soward
(74) *Attorney, Agent, or Firm* — Fish & Richardson P.C.

(57) ABSTRACT

A display device including display regions with inconspicuous seam is provided. The display device includes a first display panel and a second display panel. The first display panel includes a first display region and a visible-light-transmitting region. The second display panel includes a second display region. The first display region is adjacent to the visible-light-transmitting region. The first display region includes a first light-emitting element and a second light-emitting element. A first common electrode included in the first light-emitting element includes a portion in contact with a second common electrode included in the second light-emitting element. The first common electrode has a function of reflecting visible light. The second common electrode has a function of transmitting visible light. The second light-emitting element is positioned closer to the visible-light-transmitting region than the first light-emitting element. The second display region includes a portion overlapping with the second light-emitting element and a portion overlapping with the visible-light-transmitting region.

6 Claims, 18 Drawing Sheets

(51) Int. Cl.
*H10K 50/84* (2023.01)
*H10K 59/00* (2023.01)
*H10K 59/12* (2023.01)
*H01L 33/44* (2010.01)
*H05B 33/22* (2006.01)
*G09F 9/30* (2006.01)
*H10K 50/856* (2023.01)
*H10K 50/828* (2023.01)
*H10K 50/844* (2023.01)
*H10K 59/90* (2023.01)
*H10K 50/818* (2023.01)
*H10K 59/123* (2023.01)

(52) U.S. Cl.
CPC ............. *H10K 59/90* (2023.02); *H01L 33/44* (2013.01); *H10K 50/818* (2023.02); *H10K 59/12* (2023.02); *H10K 59/123* (2023.02)

(58) Field of Classification Search
CPC ............. H01L 51/5231; H01L 51/5209; H01L 27/3244; H01L 27/3248; H01L 27/322; H01L 27/32; H01L 27/3251; H01L 27/3246; H01L 27/326; H01L 25/048; H01L 33/44; G09F 9/30; G09F 9/40; G09F 9/46; H05B 33/14; H05B 33/12; H05B 33/22; H05B 33/26; H05B 33/04; H10K 50/856; H10K 50/868; H10K 50/844; H10K 50/818; H10K 50/822; H10K 50/826; H10K 50/813; H10K 59/90; H10K 59/12; H10K 59/123; H10K 59/127; H10K 59/38; H10K 59/00; H10K 59/122; H10K 59/121
See application file for complete search history.

(56) References Cited

U.S. PATENT DOCUMENTS

| | | | |
|---|---|---|---|
| 5,721,160 A | 2/1998 | Forrest et al. | |
| 5,757,026 A | 5/1998 | Forrest et al. | |
| 6,030,700 A | 2/2000 | Forrest et al. | |
| 6,061,477 A | 5/2000 | Lohmeyer et al. | |
| 6,219,022 B1 | 4/2001 | Yamazaki et al. | |
| 6,264,805 B1 | 7/2001 | Forrest et al. | |
| 6,358,631 B1 | 3/2002 | Forrest et al. | |
| 6,365,270 B2 | 4/2002 | Forrest et al. | |
| 6,548,956 B2 | 4/2003 | Forrest et al. | |
| 6,596,134 B2 | 7/2003 | Forrest et al. | |
| 7,023,017 B2 | 4/2006 | Ahn et al. | |
| 7,023,021 B2 | 4/2006 | Yamazaki et al. | |
| 7,173,369 B2 | 2/2007 | Forrest et al. | |
| 7,489,286 B2 | 2/2009 | Kawase et al. | |
| 7,566,903 B2 | 7/2009 | Yamazaki et al. | |
| 7,714,504 B2 | 5/2010 | Forrest et al. | |
| 7,915,615 B2 | 3/2011 | Yamazaki et al. | |
| 7,955,916 B2 | 6/2011 | Hayashi et al. | |
| 7,977,873 B2 | 7/2011 | Asano | |
| 8,125,603 B2 | 2/2012 | Oh et al. | |
| 8,194,211 B2 | 6/2012 | Nagai et al. | |
| 8,222,647 B2 | 7/2012 | Hayashi et al. | |
| 8,305,294 B2 | 11/2012 | Cok et al. | |
| 8,324,803 B2 | 12/2012 | Forrest et al. | |
| 8,399,884 B2 | 3/2013 | Yamazaki et al. | |
| 8,461,595 B2 | 6/2013 | Hayashi et al. | |
| 8,508,432 B2 | 8/2013 | Shim et al. | |
| 8,704,233 B2 | 4/2014 | Yamazaki et al. | |
| 8,735,872 B2 | 5/2014 | Kim et al. | |
| 8,773,602 B2 | 7/2014 | Kim et al. | |
| 8,809,855 B2 | 8/2014 | Yamazaki et al. | |
| 9,088,006 B2 | 7/2015 | Yamazaki et al. | |
| 9,250,456 B2 | 2/2016 | Tomoda et al. | |
| 9,298,035 B2 | 3/2016 | Yamazaki et al. | |
| 9,303,842 B2 | 4/2016 | Cheon | |
| 9,318,610 B2 | 4/2016 | Yamazaki et al. | |
| 9,379,173 B2 | 6/2016 | Kojima et al. | |
| 9,500,922 B2 | 11/2016 | Jiang et al. | |
| 9,614,022 B2 | 4/2017 | Miyake et al. | |
| 9,620,623 B2 | 4/2017 | Yamazaki et al. | |
| 9,666,654 B2 | 5/2017 | Ha et al. | |
| 9,754,540 B2* | 9/2017 | Takesue | G09G 3/3208 |
| 9,768,201 B2* | 9/2017 | Nakamura | H01L 33/0041 |
| 9,854,629 B2 | 12/2017 | Ikeda et al. | |
| 9,858,028 B2 | 1/2018 | Ikeda et al. | |
| 9,869,907 B2 | 1/2018 | Yamazaki et al. | |
| 9,940,086 B2* | 4/2018 | Yoshizumi | H01L 51/0097 |
| 10,002,912 B2 | 6/2018 | Song et al. | |
| 10,008,684 B2 | 6/2018 | Pyo et al. | |
| 10,027,896 B2 | 7/2018 | Ikeda | |
| 10,062,861 B2 | 8/2018 | Seo et al. | |
| 10,133,531 B2* | 11/2018 | Yoshitani | G09G 3/20 |
| 10,159,135 B2 | 12/2018 | Ikeda et al. | |
| 10,312,264 B2 | 6/2019 | Nakamura et al. | |
| 10,332,859 B2 | 6/2019 | Nakamura et al. | |
| 10,347,197 B2 | 7/2019 | Yamazaki et al. | |
| 10,354,574 B2 | 7/2019 | Kobayashi et al. | |
| 10,424,632 B2 | 9/2019 | Nakamura | |
| 10,461,271 B2 | 10/2019 | Seo et al. | |
| 10,516,118 B2 | 12/2019 | Kuwabara | |
| 10,535,776 B2 | 1/2020 | Yamazaki et al. | |
| 10,559,249 B2 | 2/2020 | Yoneda | |
| 10,861,401 B2 | 12/2020 | Yamazaki et al. | |
| 2002/0009237 A1 | 1/2002 | Tezuka et al. | |
| 2008/0246781 A1 | 10/2008 | Surati et al. | |
| 2009/0051285 A1 | 2/2009 | Kajiyama et al. | |
| 2010/0078627 A1 | 4/2010 | Yoshinaga | |
| 2010/0253215 A1 | 10/2010 | Fukagawa et al. | |
| 2012/0161166 A1* | 6/2012 | Yamazaki | H10K 59/805 257/40 |
| 2012/0267611 A1 | 10/2012 | Chung et al. | |
| 2012/0267633 A1 | 10/2012 | Hayashi et al. | |
| 2012/0313099 A1 | 12/2012 | Chung et al. | |
| 2014/0159002 A1 | 6/2014 | Lee et al. | |
| 2015/0028316 A1 | 1/2015 | Kojima et al. | |
| 2015/0079710 A1 | 3/2015 | Kim et al. | |
| 2016/0037608 A1 | 2/2016 | Ikeda et al. | |
| 2016/0132281 A1 | 5/2016 | Yamazaki et al. | |
| 2016/0172423 A1* | 6/2016 | Nendai | H10K 71/135 257/40 |
| 2016/0248032 A1 | 8/2016 | Seo et al. | |
| 2017/0031643 A1 | 2/2017 | Jeong | |
| 2017/0053973 A1* | 2/2017 | Park | H10K 50/844 |
| 2017/0069664 A1* | 3/2017 | Nakamura | H01L 27/124 |
| 2017/0092177 A1 | 3/2017 | Kobayashi et al. | |
| 2017/0154947 A1* | 6/2017 | Nakamura | H01L 51/5284 |
| 2017/0373036 A1* | 12/2017 | Yamazaki | H01L 25/048 |
| 2018/0005574 A1 | 1/2018 | Kim et al. | |
| 2018/0069025 A1* | 3/2018 | Nakamura | H01L 33/62 |
| 2018/0151539 A1 | 5/2018 | Nakamura et al. | |
| 2019/0008014 A1 | 1/2019 | Ikeda et al. | |
| 2019/0304951 A1 | 10/2019 | Nakamura et al. | |
| 2019/0348011 A1 | 11/2019 | Kurokawa | |
| 2020/0194593 A1 | 6/2020 | Yamazaki et al. | |
| 2020/0396807 A1* | 12/2020 | Ikeda | H05B 33/12 |
| 2021/0020125 A1 | 1/2021 | Yamazaki et al. | |

FOREIGN PATENT DOCUMENTS

| | | |
|---|---|---|
| CN | 103066112 A | 4/2013 |
| CN | 106537486 A | 3/2017 |
| CN | 107219655 A | 9/2017 |
| EP | 1119059 A | 7/2001 |
| EP | 1128430 A | 8/2001 |
| EP | 1612658 A | 1/2006 |
| EP | 2184676 A | 5/2010 |
| JP | 10-503878 | 4/1998 |
| JP | 2004-251981 A | 9/2004 |
| JP | 2006-010811 A | 1/2006 |
| JP | 2007-234572 A | 9/2007 |
| JP | 2007-317558 A | 12/2007 |
| JP | 2009-054328 A | 3/2009 |
| JP | 2010-113359 A | 5/2010 |
| JP | 2011-048909 A | 3/2011 |

(56) References Cited

FOREIGN PATENT DOCUMENTS

| | | | | |
|---|---|---|---|---|
| JP | 2012-028638 A | 2/2012 | | |
| JP | 2012-094489 A | 5/2012 | | |
| JP | 2013-504092 | 2/2013 | | |
| JP | 2014-197522 A | 10/2014 | | |
| JP | 2016-157944 A | 9/2016 | | |
| JP | 2016-206630 A | 12/2016 | | |
| JP | 2017-054112 A | 3/2017 | | |
| JP | 2017-062474 A | 3/2017 | | |
| JP | 2017054112 A | * 3/2017 | ........... | H01L 27/124 |
| JP | 2018-010287 A | 1/2018 | | |
| JP | 2018-063399 A | 4/2018 | | |
| KR | 20150067974 A | * 6/2015 | ........... | H10K 50/818 |
| KR | 2017-0040205 A | 4/2017 | | |
| KR | 20170063378 A | * 6/2017 | ......... | H01L 27/3293 |
| TW | 201336068 | 9/2013 | | |
| TW | 201629586 | 8/2016 | | |
| TW | 201813047 | 4/2018 | | |
| WO | WO-1996/019792 | 6/1996 | | |
| WO | WO-1997/033296 | 9/1997 | | |
| WO | WO-1998/006242 | 2/1998 | | |
| WO | WO-2011/031605 | 3/2011 | | |
| WO | WO-2011/081010 | 7/2011 | | |
| WO | WO-2013/128740 | 9/2013 | | |
| WO | WO-2016/016765 | 2/2016 | | |
| WO | WO-2017/042657 | 3/2017 | | |
| WO | WO-2017/051288 | 3/2017 | | |
| WO | WO-2018/100458 | 6/2018 | | |

OTHER PUBLICATIONS

Written Opinion (Application No. PCT/IB2018/055989) dated Nov. 6, 2018.

Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.

Chinese Office Action (Application No. 201880053292.1) dated Jul. 19, 2021.

* cited by examiner

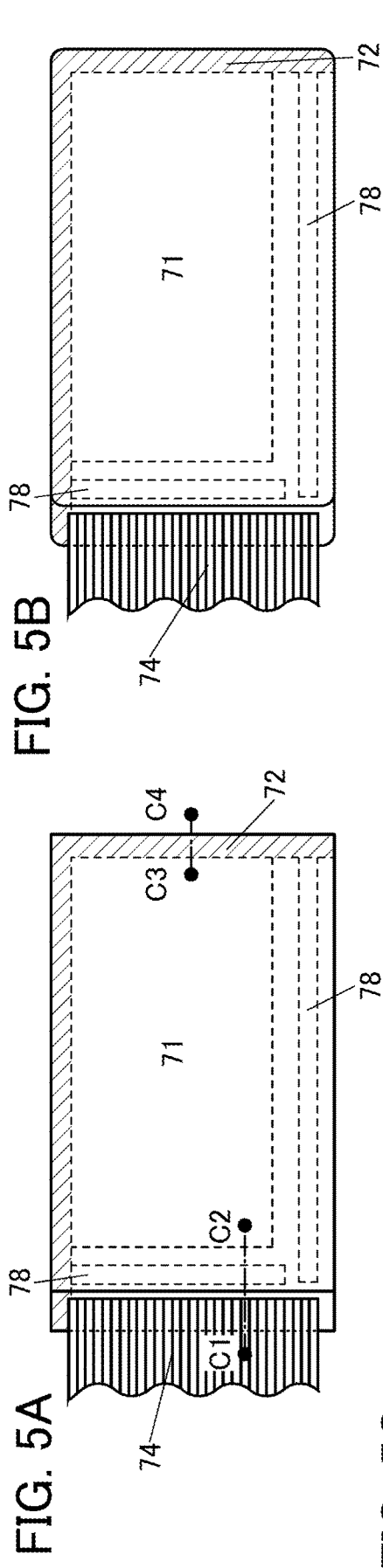
FIG. 5A
FIG. 5B
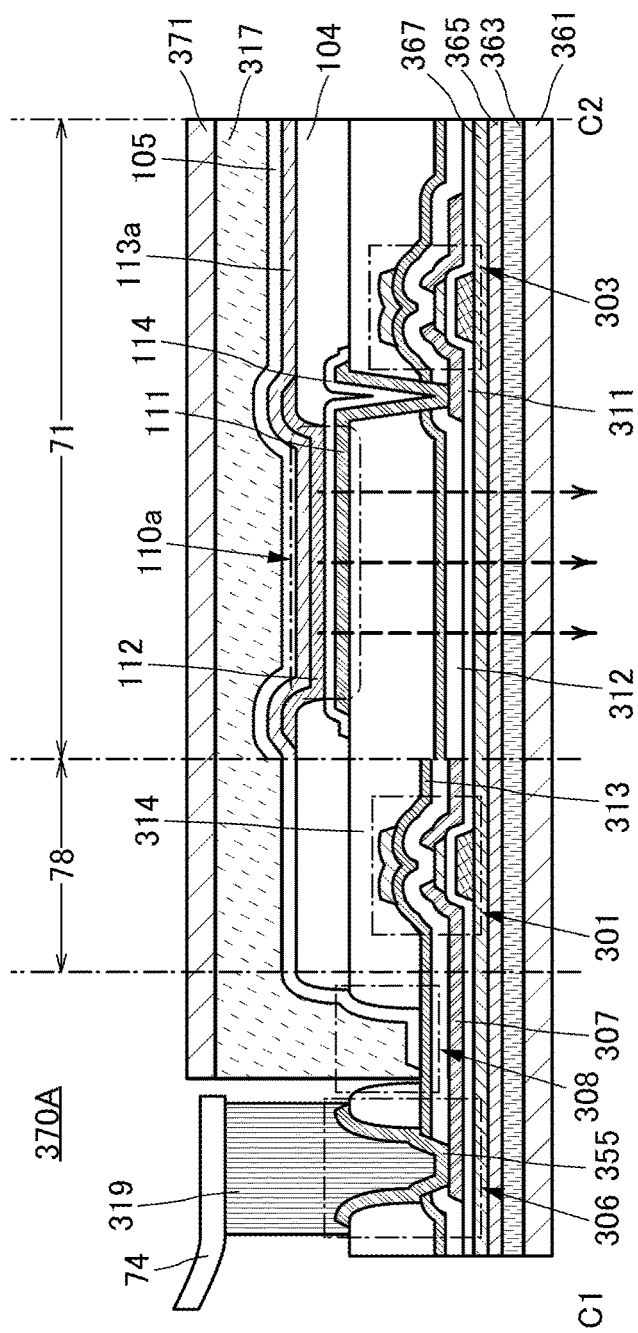
FIG. 5C

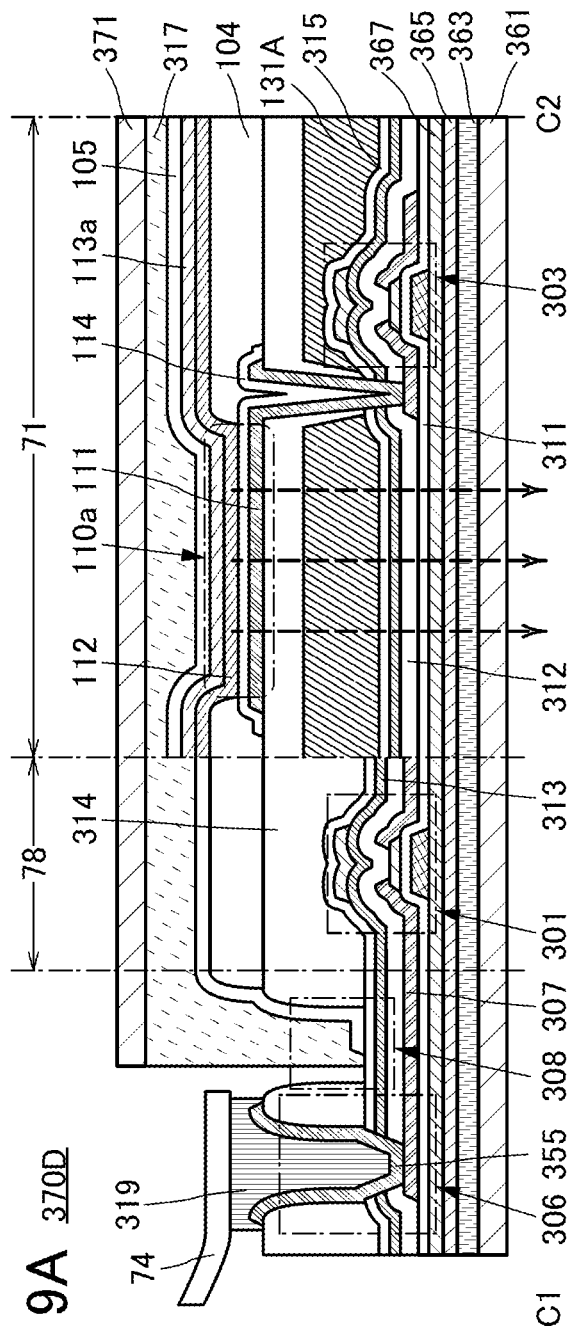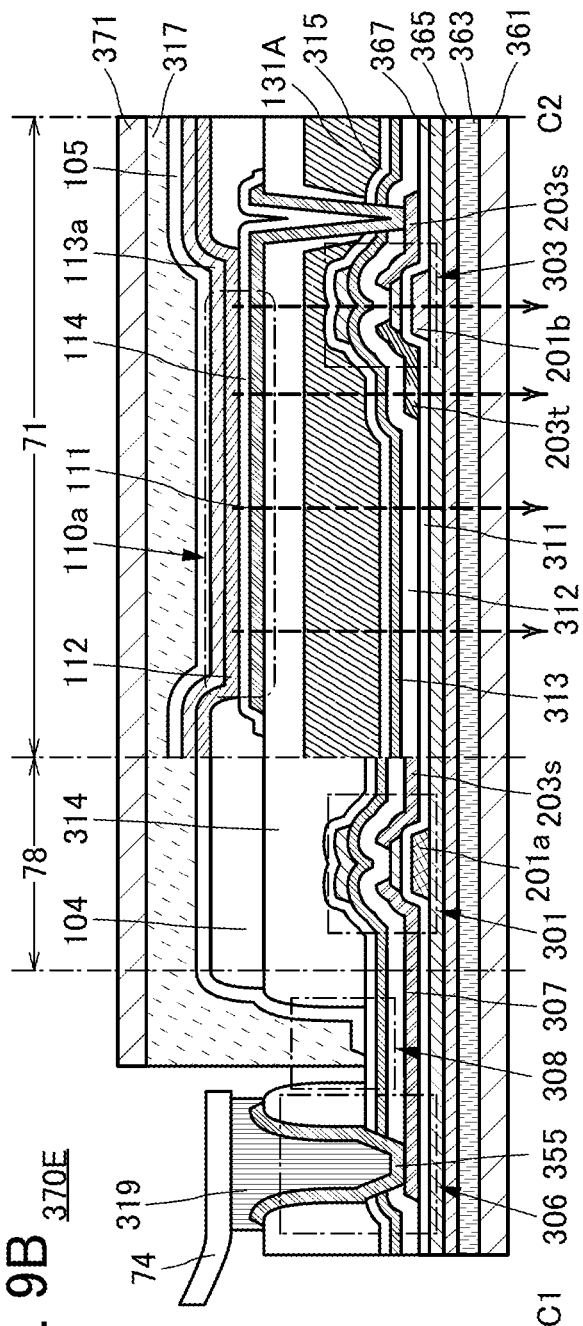

370F

370G

FIG. 16A
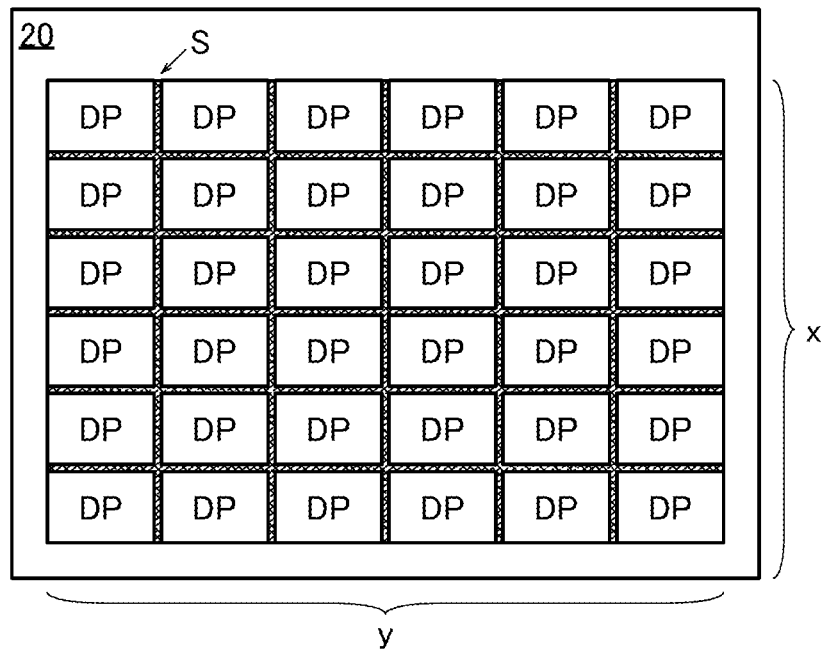
FIG. 16B1
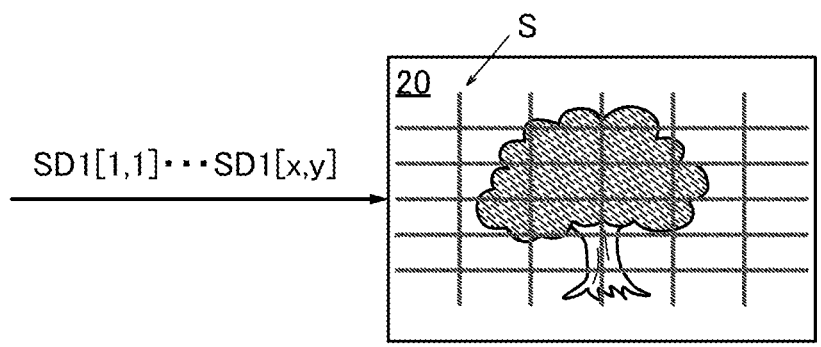
FIG. 16B2
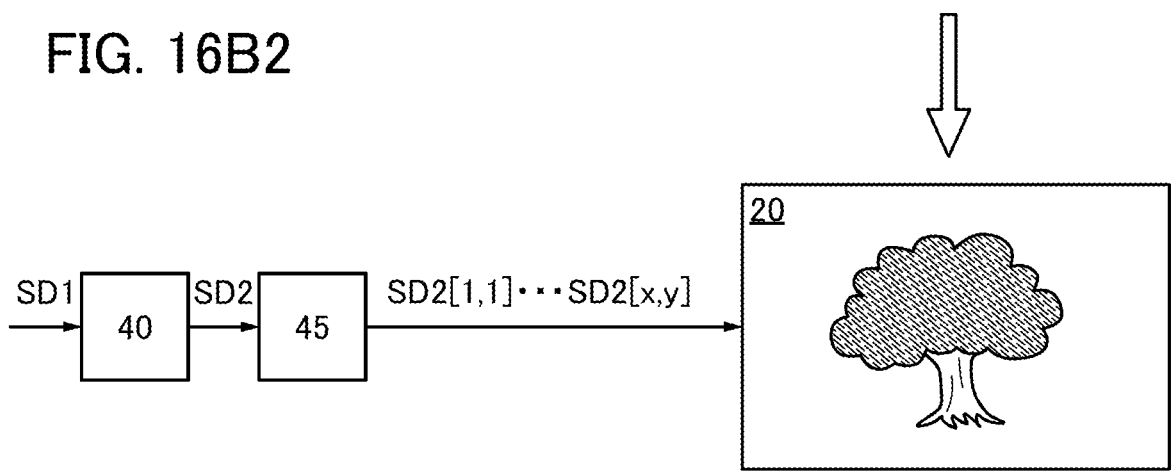

FIG. 17A1
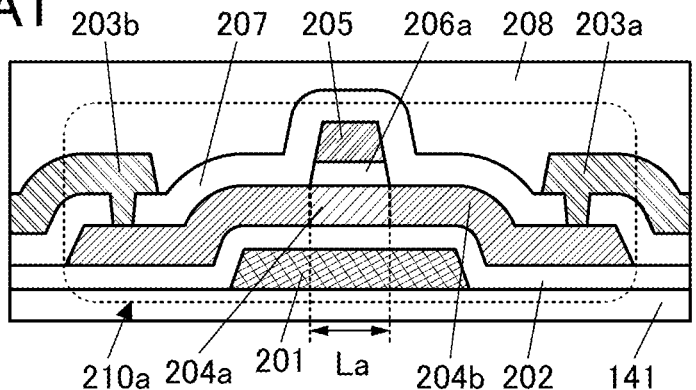
FIG. 17A2
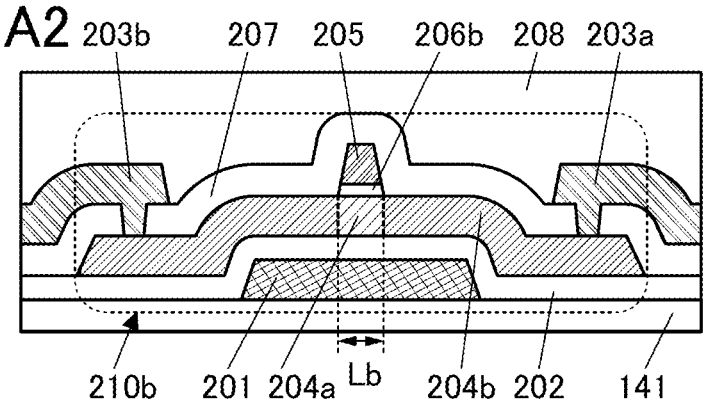
FIG. 17B
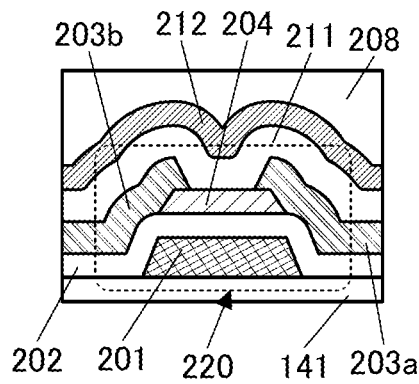
FIG. 17C
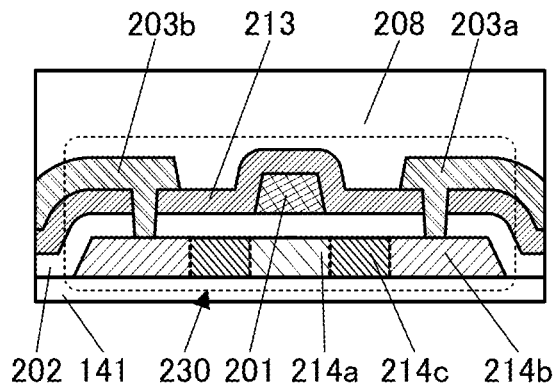
FIG. 17D
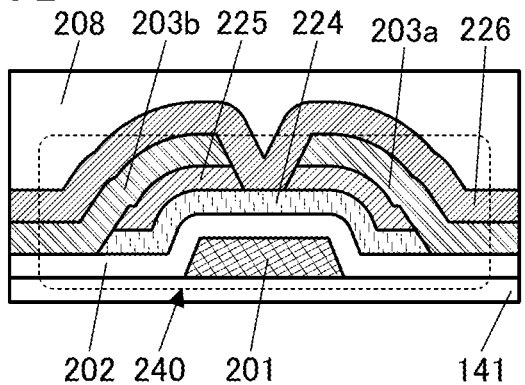

DISPLAY PANEL AND DISPLAY DEVICE INCLUDING PARTITION WALL

CROSS REFERENCE TO RELATED APPLICATIONS

This application is a divisional of U.S. application Ser. No. 16/637,801, filed Feb. 10, 2020, now allowed, which is a U.S. National Phase Application under 35 U.S.C. § 371 of International Application PCT/IB2018/055989, filed on Aug. 9, 2018, which is incorporated by reference, and which claims the benefit of a foreign priority application filed in Japan on Aug. 25, 2017, as Application No. 2017-162045.

TECHNICAL FIELD

One embodiment of the present invention relates to a display panel, a display device, an electronic device, and a manufacturing method thereof.

Note that one embodiment of the present invention is not limited to the above technical field. Examples of the technical field of one embodiment of the present invention include a semiconductor device, a display device, a light-emitting device, an electronic device, a lighting device, an input device (e.g., a touch sensor), an input-output device (e.g., a touch panel), a driving method thereof, and a manufacturing method thereof.

BACKGROUND ART

In recent years, larger display devices have been required. Examples of uses for a large display device include a television device for home use (also referred to as a TV or a television receiver), digital signage, and a PID (Public Information Display). A larger display region of a display device can provide more information at a time. In addition, a larger display region attracts more attention, so that the effectiveness of the advertisement is expected to be increased, for example.

Light-emitting elements (also referred to as EL elements) utilizing electroluminescence (hereinafter referred to as EL) have features such as ease of thinning and lightening, high-speed response to an input signal, and driving with a direct-current low voltage source, and application of the EL elements to display devices has been discussed. For example, Patent Document 1 discloses a flexible light-emitting device including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to increase the size of a display device. An object of one embodiment of the present invention is to provide a display device including a display region with an inconspicuous seam. An object of one embodiment of the present invention is to suppress display unevenness or luminance unevenness of a display device. An object of one embodiment of the present invention is to reduce the thickness or weight of a display device. An object of one embodiment of the present invention is to provide a display device that can display an image along a curved surface. An object of one embodiment of the present invention is to provide a highly browsable display device. An object of one embodiment of the present invention is to provide a novel display device.

Note that the description of these objects does not preclude the existence of other objects. In one embodiment of the present invention, there is no need to achieve all the objects. Other objects can be derived from the description of the specification, the drawings, and the claims.

Means for Solving the Problems

A display panel of one embodiment of the present invention includes a display region and a visible-light-transmitting region. The display region is adjacent to the visible-light-transmitting region. The display region includes a first light-emitting element and a second light-emitting element. The first light-emitting element includes a first pixel electrode and a first common electrode. The second light-emitting element includes a second pixel electrode and a second common electrode. The first common electrode includes a first portion overlapping with the first pixel electrode. The second common electrode includes a second portion overlapping with the second pixel electrode. The second common electrode includes a third portion in contact with the first common electrode. The first common electrode has a function of reflecting visible light. The first pixel electrode, the second pixel electrode, and the second common electrode each have a function of transmitting visible light. The second light-emitting element is positioned closer to the visible-light-transmitting region than the first light-emitting element. The second common electrode preferably includes a fourth portion. The fourth portion is a portion overlapping with the second pixel electrode and being in contact with the first common electrode. The second common electrode preferably extends to the visible-light-transmitting region. The display panel preferably includes a protective layer over the first light-emitting element and the second light-emitting element.

A display panel of one embodiment of the present invention includes a display region and a visible-light-transmitting region. The display region is adjacent to the visible-light-transmitting region. The display region includes an insulating layer, a partition wall, and a light-emitting element. The light-emitting element includes a pixel electrode and a common electrode. The insulating layer includes an opening. The insulating layer covers an end portion of the pixel electrode. The common electrode overlaps with the pixel electrode with the opening therebetween. The partition wall is positioned over the insulating layer. The partition wall is positioned between the light-emitting element and the visible-light-transmitting region. The partition wall is provided along the visible-light-transmitting region. The level of a top surface of the partition wall is higher than the level of a top surface of a portion of the common electrode that overlaps with the opening. The visible-light-transmitting region and the partition wall are preferably provided along two consecutive sides of the display region. The display panel preferably includes a protective layer over the light-emitting element.

A display device of one embodiment of the present invention includes a first display panel and a second display panel. The first display panel includes a first display region and a visible-light-transmitting region. The second display panel includes a second display region. The first display region is adjacent to the visible-light-transmitting region. The first display region includes a first light-emitting element and a second light-emitting element. The first light-emitting element includes a first pixel electrode and a first common electrode. The second light-emitting element includes a second pixel electrode and a second common electrode. The first common electrode includes a first portion overlapping with the first pixel electrode. The second common electrode includes a second portion overlapping with the second pixel electrode. The second common electrode includes a third portion in contact with the first common electrode. The first common electrode has a function of reflecting visible light. The first pixel electrode, the second pixel electrode, and the second common electrode each have a function of transmitting visible light. The second light-emitting element is positioned closer to the visible-light-transmitting region than the first light-emitting element. The second display region includes a portion overlapping with the second light-emitting element and a portion overlapping with the visible-light-transmitting region. The second common electrode preferably includes a fourth portion. The fourth portion is a portion overlapping with the second pixel electrode and being in contact with the first common electrode. The second common electrode preferably extends to the visible-light-transmitting region. The first display panel preferably includes a protective layer over the first light-emitting element and the second light-emitting element. The second display region preferably includes a third light-emitting element and a fourth light-emitting element. The third light-emitting element emits light through the second light-emitting element. The fourth light-emitting element emits light through the visible-light-transmitting region.

A display device of one embodiment of the present invention includes a first display panel and a second display panel. The first display panel includes a first display region and a visible-light-transmitting region. The second display panel includes a second display region. The first display region is adjacent to the visible-light-transmitting region. The first display region includes an insulating layer, a partition wall, and a light-emitting element. The light-emitting element includes a pixel electrode and a common electrode. The insulating layer includes an opening. The insulating layer covers an end portion of the pixel electrode. The common electrode overlaps with the pixel electrode with the opening therebetween. The partition wall is positioned over the insulating layer. The partition wall is positioned between the light-emitting element and the visible-light-transmitting region. The partition wall is provided along the visible-light-transmitting region. The level of a top surface of the partition wall is higher than the level of a top surface of a portion of the common electrode that overlaps with the opening. The second display region includes a portion overlapping with the visible-light-transmitting region. The visible-light-transmitting region and the partition wall are preferably provided along two consecutive sides of the first display region. The first display panel preferably includes a protective layer over the light-emitting element.

Effect of the Invention

One embodiment of the present invention can increase the size of a display device. One embodiment of the present invention can provide a display device including a display region with an inconspicuous seam. One embodiment of the present invention can suppress display unevenness or luminance unevenness of a display device. One embodiment of the present invention can reduce the thickness or weight of a display device. One embodiment of the present invention can provide a display device that can display an image along a curved surface. One embodiment of the present invention can provide a highly browsable display device. One embodiment of the present invention can provide a novel display device.

Note that the description of these effects does not preclude the existence of other effects. One embodiment of the present invention does not necessarily achieve all the effects. Other effects can be derived from the description of the specification, the drawings, and the claims.

BRIEF DESCRIPTION OF THE DRAWINGS

FIGS. 5A to 5C Top views and a cross-sectional view illustrating examples of display panels.

FIGS. 9A and 9B Cross-sectional views each illustrating an example of a display panel.

FIGS. 14A and 14B Top views each illustrating an arrangement example of display panels.

FIG. 16 (A) A diagram illustrating an example of a display device. (B-1) and (B-2) Diagrams illustrating an example of processing performed in the display system.

FIGS. 17A1, 17A2, 17B, 17C, and 17D Cross-sectional views illustrating structure examples of transistors.

MODE FOR CARRYING OUT THE INVENTION

Figure 1A:
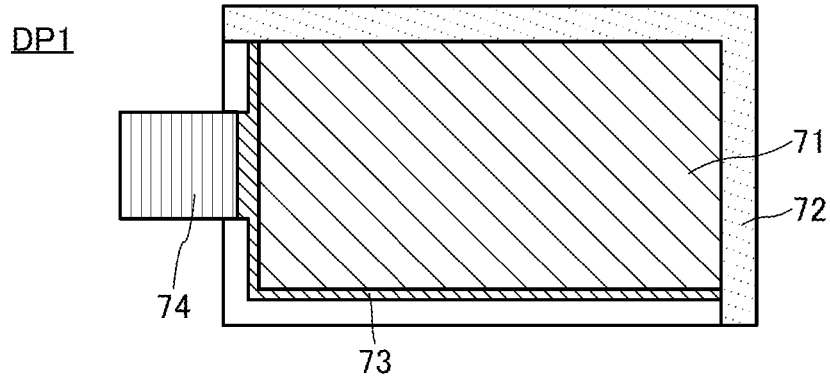
FIGS. 1A to 1D Top views and a cross-sectional view illustrating examples of display panels.

Embodiments are described in detail with reference to the drawings. Note that the present invention is not limited to the following description and it is readily appreciated by those skilled in the art that modes and details of the present invention can be modified in various ways without departing from the spirit and scope of the present invention. Thus, the present invention should not be construed as being limited to the description in the following embodiments.

Note that in the structures of the invention described below, the same portions or portions having similar functions are denoted by the same reference numerals in different drawings, and description of such portions is not repeated.

Furthermore, the same hatching pattern is applied to portions having similar functions, and the portions are not especially denoted by reference numerals in some cases.

The position, size, range, or the like of each component illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". In addition, the term "insulating film" can be changed into the term "insulating layer".

Embodiment 1

In this embodiment, display panels and a display device of embodiments of the present invention will be described with reference to FIG. 1 to FIG. 17.

When a plurality of display panels are arranged in one or more directions (e.g., in one column or in a matrix), a display device with a large display region can be manufactured.

In the case where a large display device is manufactured using a plurality of display panels, each of the display panels is not required to be large. Thus, an apparatus for manufacturing the display panel does not need to be increased in size, whereby space-saving can be achieved. Furthermore, since an apparatus for manufacturing small- and medium-sized display panels can be used and a novel apparatus does not need to be utilized for larger display devices, manufacturing cost can be reduced. In addition, a decrease in yield caused by an increase in the size of a display panel can be suppressed.

A display portion including a plurality of display panels has a larger display region than a display portion including one display panel when the display panels have the same size, and has an effect of displaying more information at a time, for example.

Here, the case where a display panel includes a non-display region that is provided to surround a display region is considered. In this case, for example, when output images of a plurality of display panels are combined to show one image, the one image is seen by a user of the display device as being divided.

Making the non-display regions of the display panels small (using display panels with narrow frames) can inhibit display on the display panels from appearing divided; however, it is difficult to totally remove the non-display regions of the display panels.

A small non-display region of the display panel leads to a decrease in the distance between an end portion of the display panel and an element in the display panel, in which case the element easily deteriorates by impurities entering from outside the display panel in some cases.

Thus, in one embodiment of the present invention, a plurality of display panels are arranged to partly overlap with one another. In two display panels overlapping with each other, at least the display panel positioned on the display surface side (upper side) includes a visible-light-transmitting region and a display region adjacent to each other. In one embodiment of the present invention, a display region of the display panel positioned on a lower side and the visible-light-transmitting region of the display panel positioned on the upper side overlap with each other. Thus, a non-display region between the display regions of the two overlapping display panels can be reduced and even removed. As a result, a large-sized display device in which a seam between the display panels is hardly seen by the user can be obtained.

At least part of a non-display region of the display panel positioned on the upper side transmits visible light, and can overlap with the display region of the display panel positioned on the lower side. Furthermore, at least part of a non-display region of the display panel positioned on the lower side can overlap with the display region or a visible-light-blocking region of the display panel positioned on the upper side. It is not necessary to reduce the areas of these parts because a reduction in the area of the frame of the display device (a reduction in area except a display region) is not affected by these parts.

A large non-display region of the display panel leads to an increase in the distance between the end portion of the display panel and an element in the display panel, in which case the deterioration of the element due to impurities entering from outside the display panel can be suppressed. For example, in the case where an organic EL element is used as a display element, impurities such as moisture and oxygen are less likely to enter (or less likely to reach) the organic EL element from outside the display panel as the distance between the end portion of the display panel and the organic EL element increases. Since a sufficient area of the non-display region of the display panel can be secured in the display device of one embodiment of the present invention, a highly reliable large display device can be fabricated even when a display panel including an organic EL element or the like is used.

Thus, in the case where the plurality of display panels are provided in the display device, the plurality of display panels are preferably arranged such that the display region is continuous over adjacent display panels.

The display panel of this embodiment has a bottom-emission structure.

In a top-emission display panel, a common electrode needs to transmit visible light because light emitted from a light-emitting element is extracted to the outside through the common electrode. The use of a visible-light-transmitting conductive material causes a problem of high resistance of the common electrode. When a voltage drop due to the resistance of the common electrode occurs, potential distribution in a display surface becomes non-uniform, variation in luminance of light-emitting elements is caused, and the display quality is degraded.

In contrast, the display panel of this embodiment has a bottom-emission structure and the visible-light-transmitting property of the common electrode does not matter because light emitted from a light-emitting element is extracted to the outside through a pixel electrode. The use of a metal, an alloy, or the like having low resistivity can increase the conductivity of the common electrode; thus, a voltage drop due to the resistance of the common electrode can be suppressed and the display quality can be improved. An auxiliary wiring or the like for reducing the resistance of the common electrode does not need to be provided, so that the structure of the display panel can be simplified.

Specific Example 1 of Display Panel

FIG. 1(A) shows a top view of a display panel DP1.

The display panel DP1 illustrated in FIG. 1(A) includes a display region 71, a visible-light-transmitting region 72, and a visible-light-blocking region 73. The visible-light-transmitting region 72 and the visible-light-blocking region 73 are each provided adjacent to the display region 71. FIG. 1(A) shows an example in which the display panel DP1 is provided with an FPC 74.

The display region 71 includes a plurality of pixels. In the visible-light-transmitting region 72, a pair of substrates that constitutes the display panel DP1, a sealant for sealing a display element interposed between the pair of substrates, and the like may be provided. At this time, for members provided in the visible-light-transmitting region 72, visible-light-transmitting materials are used. In the visible-light-blocking region 73, for example, a wiring electrically connected to the pixel included in the display region 71 may be provided. Moreover, one or both of a scan line driver circuit and a signal line driver circuit may be provided in the visible-light-blocking region 73. Furthermore, a terminal connected to the FPC 74, a wiring connected to the terminal, or the like may be provided in the visible-light-blocking region 73.

The display panel DPI has a bottom-emission structure. FIG. 1(A) illustrates a surface opposite to a display surface of the display panel DP1.

Figures 1B, 1C:
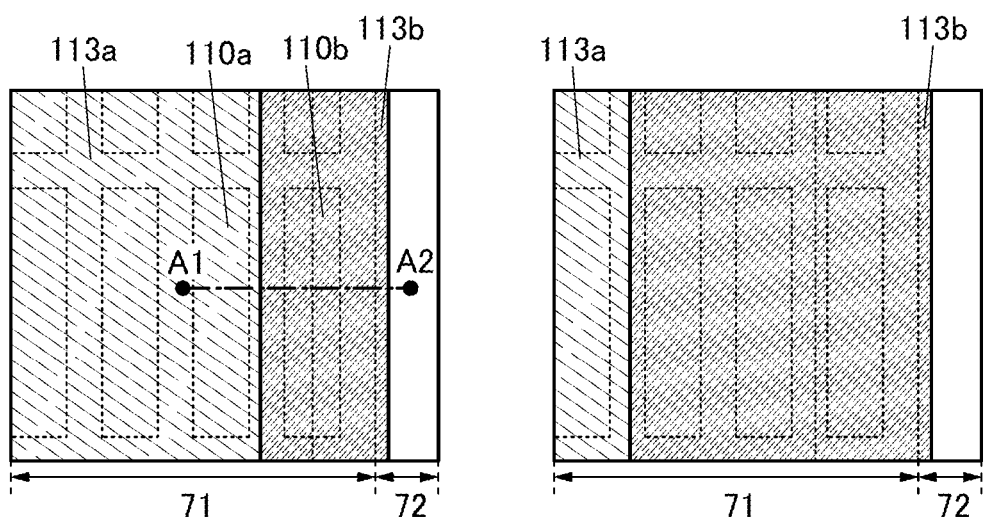
Figure 1D:
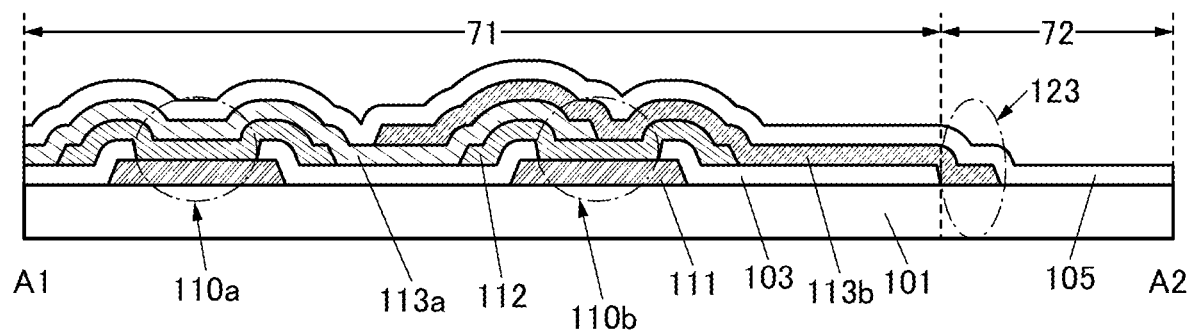

FIGS. 1(B) and 1(C) each show an enlarged view of a portion including a boundary between the display region 71 and the visible-light-transmitting region 72 in the display panel DP1. FIG. 1(D) is a cross-sectional view along dashed-dotted line A1-A2 in FIG. 1(B).

Figure 2A:
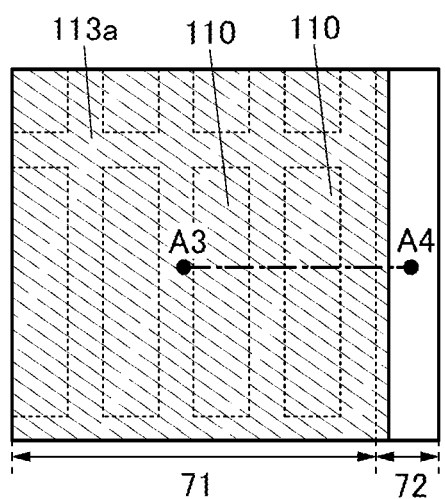
FIGS. 2A and 2B A top view and a cross-sectional view illustrating a comparison example of a display panel.
Figure 2B:
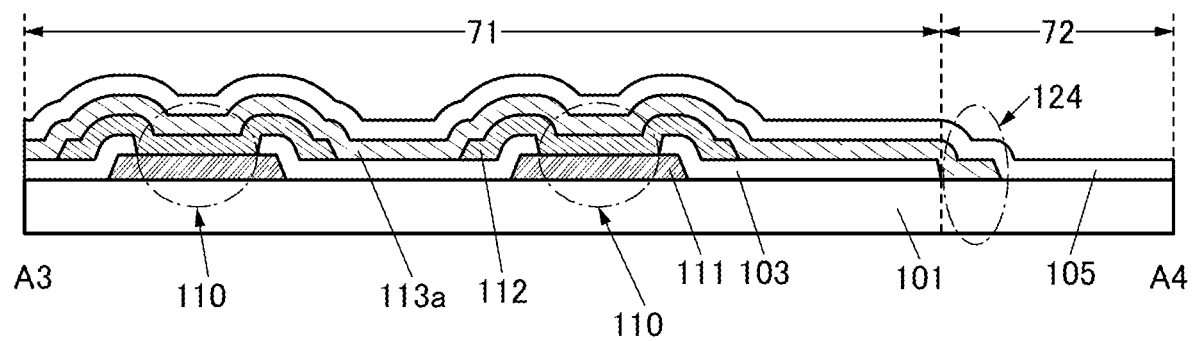

FIG. 2(A) shows an enlarged view of a portion including a boundary between the display region 71 and the visible-light-transmitting region 72 in a display panel of a comparative example. FIG. 2(B) is a cross-sectional view along dashed-dotted line A3-A4 in FIG. 2(A).

The display panel of the comparative example in FIGS. 2(A) and 2(B) includes a substrate 101, light-emitting elements 110, an insulating layer 103, and a protective layer 105.

The light-emitting element 110 includes a pixel electrode 111, an EL layer 112, and a common electrode 113a. The pixel electrode 111 is provided over the substrate 101, the EL layer 112 is provided over the pixel electrode 111, and the common electrode 113a is provided over the EL layer 112. The pixel electrode 111 has a function of transmitting visible light. The common electrode 113a has a function of reflecting visible light. The light-emitting element 110 emits light to the substrate 101 side.

When a voltage higher than the threshold voltage of the light-emitting element 110 is applied between the pixel electrode 111 and the common electrode 113a, holes are injected to the EL layer 112 from the anode side and electrons are injected to the EL layer 112 from the cathode side. The injected electrons and holes are recombined in the EL layer 112 and a light-emitting substance contained in the EL layer 112 emits light.

Here, when the common electrode is formed, the common electrode is sometimes formed in an area wider than a desired region due to bending of a metal mask. Thus, as illustrated in FIGS. 2(A) and 2(B), the common electrode 113a is provided not only to be in the display region 71 but also to extend to the visible-light-transmitting region 72 in some cases. When the common electrode 113a includes a metal film, an alloy film, or the like, the light-transmitting property of a portion of the visible-light-transmitting region 72 to which the common electrode 113a extends decreases. Specifically, in the visible-light-transmitting region 72, a difference in light-transmitting property arises between a region 124 illustrated in FIG. 2(B) and other regions. Thus, when the visible-light-transmitting region 72 overlaps with a display region of another display panel, a difference in light extraction efficiency might be made, leading to display unevenness. In addition, light emitted from a light-emitting element cannot be taken out sufficiently in the region 124 when the region 124 overlaps with a display region of another display panel, and a seam between the two display panels is easily recognized in some cases.

In view of this, in one embodiment of the present invention, as illustrated in FIGS. 1(B) to 1(D), a common electrode 113b transmitting visible light is used for a light-emitting element adjacent to the visible-light-transmitting region 72.

FIG. 1(B) illustrates an example in which the common electrode 113b is used for light-emitting elements in one column on the visible-light-transmitting region 72 side. FIG. 1(C) illustrates an example in which the common electrode 113b is used for light-emitting elements in three columns on the visible-light-transmitting region 72 side. The common electrode 113b can be used for light-emitting elements in one column or a plurality of columns.

Furthermore, in the case where the visible-light-transmitting region 72 is provided along two consecutive sides of the display region 71 as illustrated in FIG. 1(A), the common electrode 113b is preferably used also for light-emitting elements in one row or a plurality of rows on the visible-light-transmitting region 72 side.

As illustrated in FIG. 1(D), a light-emitting element 110b using the common electrode 113b is provided between a light-emitting element 110a using the common electrode 113a and the visible-light-transmitting region 72. Thus, even when the common electrode 113a is formed in an area wider than a desired region due to bending of a metal mask, the common electrode 113a can be inhibited from extending to the visible-light-transmitting region 72. For this reason, the light-transmitting property of the common electrode 113a is not limited, and a metal, an alloy, or the like having low resistivity can be used. Accordingly, a voltage drop due to the resistance of the common electrode 113a can be suppressed and the display quality can be increased.

Even when the common electrode 113b extends to the visible-light-transmitting region 72 due to bending of a metal mask, a reduction in light-transmitting property of the visible-light-transmitting region 72 can be inhibited because the common electrode 113b has a function of transmitting visible light. Specifically, in the visible-light-transmitting region 72, a difference in light-transmitting property can be narrowed between a region 123 illustrated in FIG. 1(D) and other regions. Thus, when the visible-light-transmitting region 72 overlaps with a display region of another display panel, a difference in light extraction efficiency is not easily made and display unevenness can be inhibited. In addition, light emitted from a light-emitting element can be taken out sufficiently also in the region 123 when the region 123 overlaps with a display region of another display panel, and a seam between the two display panels cannot be easily recognized. Consequently, the display quality of the display device can be increased.

The display panel illustrated in FIG. 1(D) includes the substrate 101, the light-emitting element 110a, the light-emitting element 110b, the insulating layer 103, and the protective layer 105.

The light-emitting element 110a includes the pixel electrode 111, the EL layer 112, and the common electrode 113a. The pixel electrode 111 is provided over the substrate 101, the EL layer 112 is provided over the pixel electrode 111, and the common electrode 113a is provided over the EL layer 112. The pixel electrode 111 has a function of transmitting visible light. The common electrode 113a has a function of reflecting visible light. The light-emitting element 110a emits light to the substrate 101 side.

The light-emitting element 110b includes the pixel electrode 111, the EL layer 112, and the common electrode 113b. The pixel electrode 111 is provided over the substrate 101, the EL layer 112 is provided over the pixel electrode 111, and the common electrode 113b is provided over the EL layer 112. The pixel electrode 111 and the common electrode 113b each have a function of transmitting visible light. The common electrode 113a is provided for a portion of the light-emitting element 110b. The portion of the light-emitting element 110b emits light to the substrate 101 side. The other portion of the light-emitting element 110b emits light to both the substrate 101 side and the protective layer 105 side (the light-emitting element 110b can be said to have a dual-emission structure).

The visible-light-transmitting property of the common electrode 113b is preferably higher than the visible-light-transmitting property of the common electrode 113a. For example, the average value of transmittance of light in a wavelength range of greater than or equal to 450 nm to less than or equal to 700 nm of the common electrode 113b is preferably higher than the average value of transmittance of light in a wavelength range of greater than or equal to 450 nm to less than or equal to 700 nm of the common electrode 113a.

The common electrode 113b includes a portion in contact with the common electrode 113a. This portion can be provided to overlap with the insulating layer 103. Furthermore, the portion may be provided to overlap with the pixel electrode 111 included in the light-emitting element 110b.

The pixel electrode 111 is an electrode on a side where light is extracted. It is preferable that the pixel electrode 111 and the common electrode 113b each include a visible-light-transmitting conductive film.

The visible-light-transmitting conductive film can be formed using, for example, indium oxide, indium tin oxide (ITO), indium zinc oxide, zinc oxide (ZnO), gallium zinc oxide (Ga—Zn oxide), or aluminum zinc oxide (Al—Zn oxide). A metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can also be used by being formed to be thin enough to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

The EL layer 112 includes at least a light-emitting layer. The EL layer 112 may include a plurality of light-emitting layers. In addition to the light-emitting layer, the EL layer 112 may further include a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like. The EL layer 112 contains one or more kinds of light-emitting substances.

Either a low molecular compound or a high molecular compound can be used for the EL layer 112, and an inorganic compound may also be contained. The layers that constitute the EL layer 112 can each be formed by a method such as an evaporation method (including a vacuum evaporation method), a transfer method, a printing method, an inkjet method, or a coating method.

The light-emitting element may be a single element including one EL layer or a tandem element in which a plurality of EL layers are stacked with a charge generation layer therebetween.

In one embodiment of the present invention, a light-emitting element using an inorganic compound such as a quantum dot may be employed.

The common electrode 113a preferably includes a visible-light-reflecting conductive film.

For the visible-light-reflecting conductive film, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material or the alloy. Moreover, the visible-light-reflecting conductive film can be formed using an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium. An alloy containing silver and copper is preferable because of its high heat resistance. When a metal film or a metal oxide film is stacked on an aluminum alloy film, oxidation of the aluminum alloy film can be suppressed. Examples of a material for the metal film or the metal oxide film are titanium and titanium oxide. Alternatively, a visible-light-transmitting conductive film described later and a conductive film containing the metal material or the alloy may be stacked. For example, it is possible to use a stacked film of silver and ITO or a stacked film of an alloy of silver and magnesium and ITO.

The pixel electrode 111, the common electrode 113a, and the common electrode 113b can each be formed by an evaporation method or a sputtering method. Alternatively, a discharging method such as an inkjet method, a printing method such as a screen printing method, or a plating method can be used.

The insulating layer 103 is provided over the substrate 101. The insulating layer 103 has an opening overlapping with the pixel electrode 111. A light-emitting region of the light-emitting element corresponds to a portion where the opening is formed in the insulating layer 103. The insulating layer 103 covers an end portion of the pixel electrode 111.

The protective layer 105 is provided to cover a plurality of light-emitting elements. When a film with a high barrier property is used as the protective layer 105, entry of impurities such as moisture and oxygen into the light-emitting element can be inhibited. Thus, deterioration of the light-emitting elements can be suppressed and the reliability of the display panel can be improved.

The protective layer 105 is provided over the common electrode 113a and the common electrode 113b. The protective layer 105 is provided on a side opposite to the side where light is extracted, and the visible-light-transmitting property thereof is not limited. Accordingly, the range of choices for a material that can be used for the protective layer 105 can be widened. For example, an inorganic insulating film having absorption in the visible region, such as a silicon nitride film, can be formed to be thick. Furthermore, an organic insulating film such as a colored polyimide film can be provided. Note that in the case where the protective layer 105 has a low visible-light-transmitting property, the protective layer 105 is preferably provided not to extend to the visible-light-transmitting region 72. For example, an end portion of the protective layer 105 is preferably positioned in the display region 71. It is preferable that the protective layer 105 cover an end portion of the EL layer 112 and be in contact with a layer with a high barrier property outside the end portion of the EL layer 112. Thus, entry of impurities into the light-emitting element can be suppressed and the reliability of the display panel can be improved.

The insulating layer 103 and the protective layer 105 each preferably include an inorganic film (or an inorganic insulating film). When the light-emitting element is surrounded by the inorganic films, entry of impurities such as moisture and oxygen from the outside into the light-emitting element can be suppressed. A reaction between impurities and an organic compound or a metal material contained in the light-emitting element might cause deterioration of the light-emitting element. In view of the above, a structure with which impurities are less likely to enter the light-emitting element is employed, whereby deterioration of the light-emitting element can be suppressed and the reliability of the light-emitting element can be improved.

In the case where the EL layers 112 of two light-emitting elements are separated from each other as illustrated in FIG. 1(D), it is preferable that the common electrode 113a or the common electrode 113b cover the end portion of the EL layer 112 and that the common electrode 113a or the common electrode 113b be in contact with the insulating layer 103 and the protective layer 105 outside the end portion of the EL layer 112. In particular, these three layers (i.e., the common electrode 113a or the common electrode 113b, the insulating layer 103, and the protective layer 105) are preferably inorganic films, in which case impurities can be less likely to enter the EL layer 112.

The inorganic film (or inorganic insulating film) preferably has a high moisture barrier property through which water is less likely to be diffused and transmitted. The inorganic film (or inorganic insulating film) through which one or both of hydrogen and oxygen are less likely to be diffused and transmitted is further preferable. Thus, the inorganic film (or inorganic insulating film) can serve as a barrier film. Diffusion of impurities from the outside into the light-emitting element can be effectively suppressed, so that a highly reliable display panel can be provided.

The insulating layer 103 can be formed of one or more insulating films. The protective layer 105 preferably includes one or more insulating films. As each of the insulating layer 103 and the protective layer 105, an oxide insulating film, a nitride insulating film, an oxynitride insulating film, a nitride oxide insulating film, or the like can be used. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film. Examples of the nitride oxide insulating film include a silicon nitride oxide film.

Note that in this specification and the like, an oxynitride refers to a material whose oxygen content is higher than the nitrogen content as for the composition, and a nitride oxide refers to a material whose nitrogen content is higher than the oxygen content as for the composition.

In particular, a silicon nitride film, a silicon nitride oxide film, and an aluminum oxide film are preferable as the insulating layer 103 and the protective layer 105 because of a high moisture barrier property.

An inorganic film containing ITO, Ga—Zn oxide, Al—Zn oxide, In—Ga—Zn oxide, or the like can also be used as the protective layer 105. The inorganic film preferably has high resistance, specifically, higher resistance than the common electrode 113b. The inorganic film may further contain nitrogen.

The visible-light-transmitting conductive film used as the common electrode 113b and the visible-light-transmitting inorganic film used as the protective layer 105 may contain a common metal element, for example. Adhesion between the common electrode 113b and the protective layer 105 can be increased when the two films contain a common metal element, whereby film separation and entry of impurities from an interface can be inhibited.

A first ITO film can be used as the common electrode 113b and a second ITO film can be used as the protective layer 105, for example. The second ITO film is preferably a film that has a higher resistivity than the first ITO film. Furthermore, a first Ga—Zn oxide film can be used as the common electrode 113b and a second Ga—Zn oxide film can be used as the protective layer 105, for example. The second Ga—Zn oxide film is preferably a film that has a higher resistivity than the first Ga—Zn oxide film.

An inorganic film containing Ga, Zn, and O can be obtained by deposition in an oxygen atmosphere or a mixed atmosphere of argon and oxygen with the use of a Ga—Zn—O-based metal oxide target (a mixed sintered body of $Ga_2O_3$ and ZnO), for example. An insulating film containing Al, Zn, and O can be obtained by deposition in a similar atmosphere with the use of an Al—Zn—O-based metal oxide target (a mixed sintered body of $Al_2O_3$ and ZnO), for example. An inorganic film containing Ga or Al and Zn, O, and N can be obtained by deposition in a mixed atmosphere of argon, oxygen, and nitrogen with the use of a similar target.

The specific resistance of each of the insulating layer 103 and the protective layer 105 is preferably higher than or equal to $10^{10}$ Ωcm at 20° C.

The insulating layer 103 and the protective layer 105 can each be formed by a chemical vapor deposition (CVD) method (such as a plasma-enhanced chemical vapor deposition (PECVD) method), a sputtering method (such as a DC sputtering method, an RF sputtering method, or an ion beam sputtering method), an atomic layer deposition (ALD) method, or the like.

A sputtering method and an ALD method are capable of deposition at a low temperature. The EL layer 112 included in the light-emitting element has a low heat resistance. Therefore, the protective layer 105 formed after the fabrication of the light-emitting element is preferably formed at a comparatively low temperature, typically at lower than or equal to 100° C., and a sputtering method and an ALD method are suitable.

The insulating layer 103 formed before the fabrication of the light-emitting element can be deposited at a high temperature. By setting substrate temperature during deposition to a high temperature (e.g., higher than or equal to 100° C. and lower than or equal to 350° C.), a dense film with a high barrier property can be formed. Not only a sputtering method and an ALD method but also a CVD method is suitable for forming the insulating layer 103. A CVD method has a high deposition rate; thus, it is preferable.

As the insulating layer 103 or the protective layer 105, two or more insulating films formed by different deposition methods may be stacked.

It is preferable that a first inorganic film be formed by a sputtering method and a second inorganic film be formed by an ALD method, for example.

A film formed by a sputtering method contains fewer impurities and has higher density than a film formed by an ALD method. The film formed by an ALD method has higher step coverage and is less likely to be influenced by the shape of a deposition surface than the film formed by a sputtering method.

The first inorganic film contains few impurities and has high density. The second inorganic film is formed so as to cover a portion which is not sufficiently covered with the first inorganic film by the influence of a step of the formation surface. Thus, it is possible to form a protective layer capable of further reducing diffusion of water or the like than a protective layer in which only one of the inorganic films is formed.

Specifically, it is preferable that an aluminum oxide film, a zirconium oxide film, an ITO film, a Ga—Zn oxide film, an Al—Zn oxide film, or an In—Ga—Zn oxide film be formed by a sputtering method, and then an aluminum oxide film or a zirconium oxide film be formed by an ALD method.

The thickness of the inorganic film formed by a sputtering method is preferably greater than or equal to 50 nm and less than or equal to 1000 nm, further preferably greater than or equal to 100 nm and less than or equal to 300 nm.

The thickness of the inorganic film formed by an ALD method is preferably greater than or equal to 1 nm and less than or equal to 100 nm, further preferably greater than or equal to 5 nm and less than or equal to 50 nm.

The water vapor transmission rate of each of the insulating layer 103 and the protective layer 105 is lower than $1\times10^{-2}$ g/(m²·day), preferably lower than or equal to $5\times10^{-3}$ g/(m²·day), further preferably lower than or equal to $1\times10^{-4}$ g/(m²·day), still further preferably lower than or equal to $1\times10^{-5}$ g (m²·day), yet further preferably lower than or equal to $1\times10^{-6}$ g/(m²·day). The lower the water vapor transmission rate is, the more diffusion of water from the outside into the transistor and the light-emitting element can be reduced.

The thickness of the insulating layer 103 and the thickness of the protective layer 105 are each greater than or equal to 1 nm and less than or equal to 1000 nm, preferably greater than or equal to 50 nm and less than or equal to 500 nm, further preferably greater than or equal to 100 nm and less than or equal to 300 nm. The thickness of the insulating layer is preferably smaller because the whole display panel can be thinner. The thinner the insulating layer is, the more throughput is improved, so that the productivity of the display panel can be improved.

Note that the insulating layer 103 and the protective layer 105 can each have a single-layer structure or a stacked-layer structure including one or both of an inorganic film (an inorganic insulating film) and an organic insulating film.

Examples of an organic insulating material that can be used for the organic insulating film include an acrylic resin, an epoxy resin, a polyimide resin, a polyamide resin, a polyimide-amide resin, a polysiloxane resin, a benzocyclobutene-based resin, and a phenol resin.

Next, a specific example of the display panel of one embodiment of the present invention, which is different from that in FIGS. 1(B) to 1(D), will be described with reference to FIG. 3 and FIG. 4.

Figure 3A:
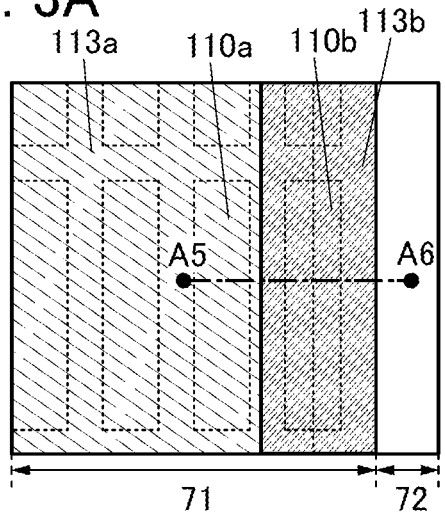
FIGS. 3A to 3D Top views and cross-sectional views illustrating examples of display panels.
Figure 3B:
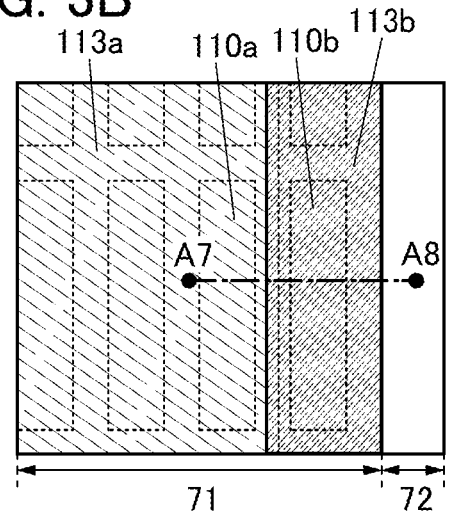
Figure 3C:
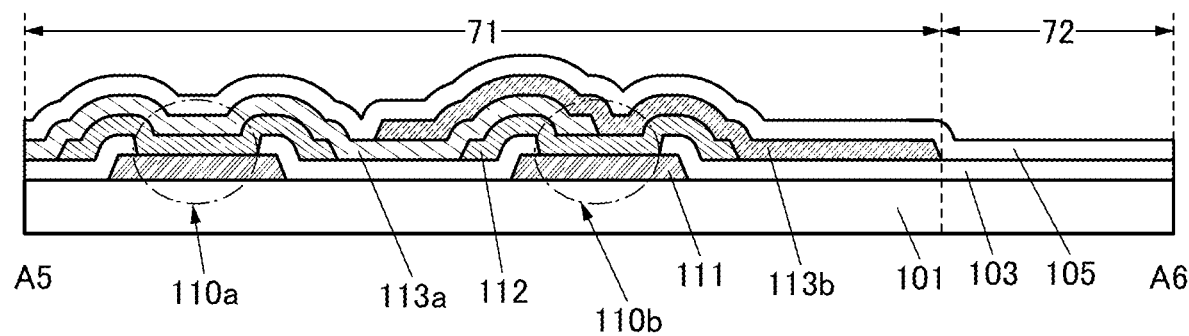
Figure 3D:
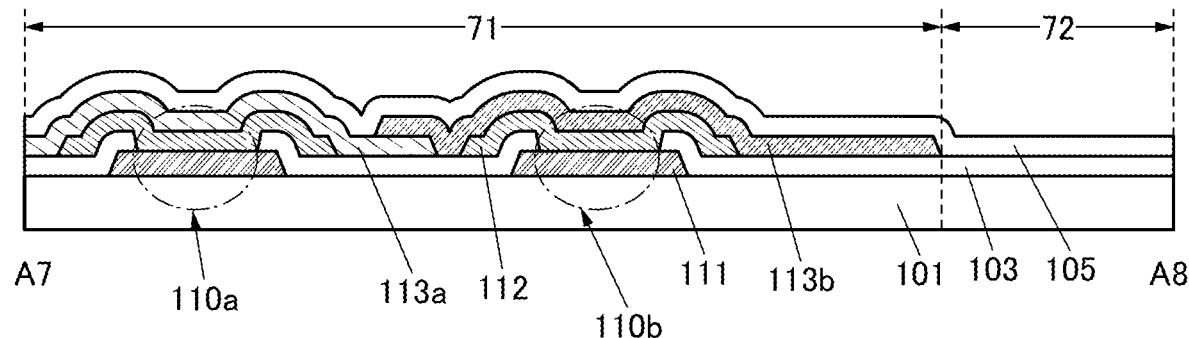

FIGS. 3(A) and 3(B) are each an enlarged view of a portion including a boundary between the display region 71 and the visible-light-transmitting region 72. FIG. 3(C) is a cross-sectional view along dashed-dotted line A5-A6 in FIG. 3(A). FIG. 3(D) is a cross-sectional view along dashed-dotted line A7-A8 in FIG. 3(B).

The common electrode can be formed in a desired region in some cases such as the case where the degree of bending of a metal mask is small. For example, as illustrated in FIGS. 3(A) and 3(C), a structure in which the common electrode 113b does not extend to the visible-light-transmitting region 72 and an end portion of the common electrode 113b is included in the display region 71 is also one embodiment of the present invention.

Furthermore, as illustrated in FIGS. 3(B) and 3(D), a structure in which the common electrode 113a does not overlap with the light-emitting region of the light-emitting element 110b is also one embodiment of the present invention. In this structure, the whole light-emitting region of the light-emitting element 110b emits light to both the substrate 101 side and the protective layer 105 side.

Figure 4A:
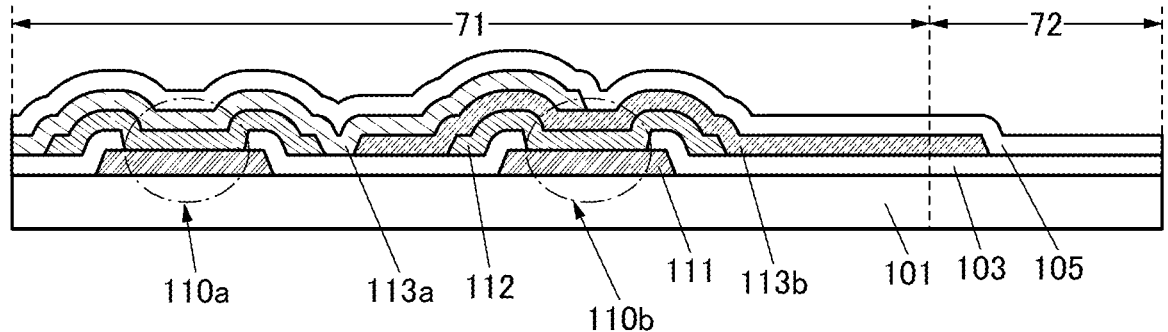
FIGS. 4A to 4C Cross-sectional views each illustrating an example of a display panel.
Figure 4B:
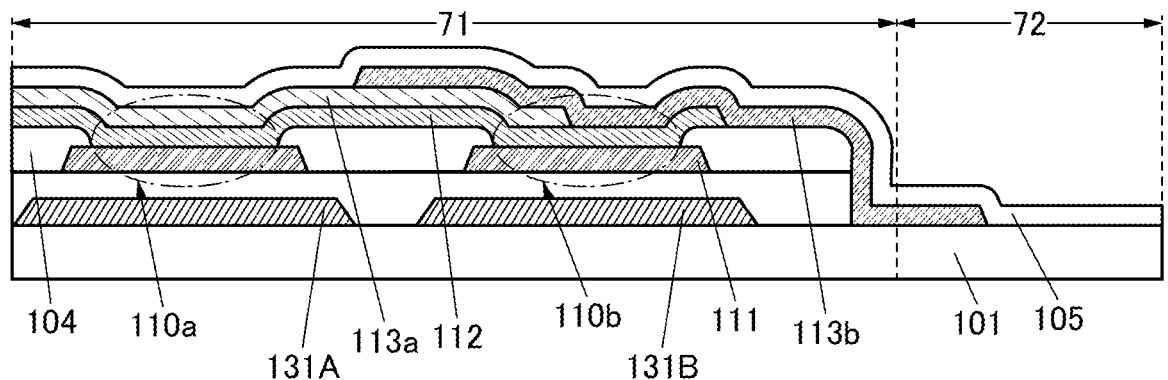
Figure 4C:
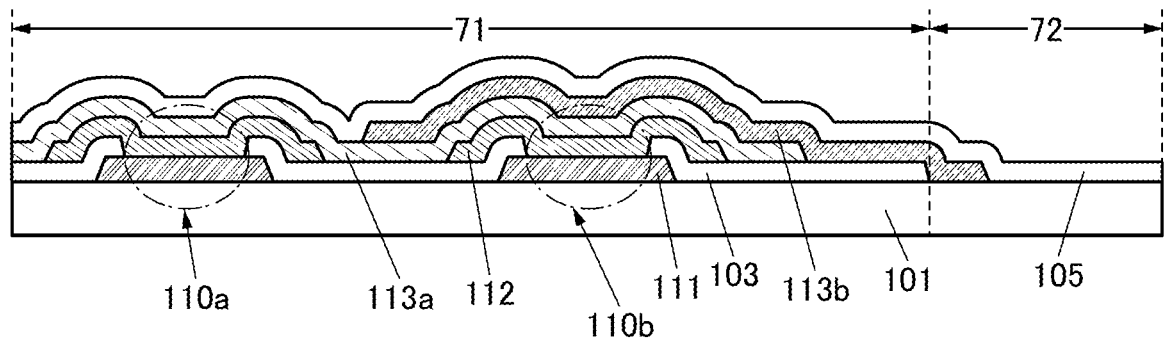

FIGS. 4(A) to 4(C) each illustrate a cross-sectional view of a portion including a boundary between the display region 71 and the visible-light-transmitting region 72.

Although an example in which the end portion of the common electrode 113b is positioned over the common electrode 113a is illustrated in FIG. 1(D) and the like, an end portion of the common electrode 113a may be positioned over the common electrode 113b as illustrated in FIG. 4(A). That is, the stacking order of the common electrode 113a having a function of reflecting visible light and the common electrode 113b having a function of transmitting visible light is not limited. The stacking order can be determined in accordance with the structure of the light-emitting element, or the like.

As illustrated in FIG. 4(B), an insulating layer 104 having a planarization function may be used instead of the insulating layer 103. The insulating layer 104 is preferably formed using the above-described organic insulating material.

When an inorganic insulating film is used as the insulating layer covering the end portion of the pixel electrode 111, impurities are less likely to enter the light-emitting element as compared with the case where an organic insulating film is used; therefore, the reliability of the light-emitting element can be improved. When an organic insulating film is used as the insulating layer covering the end portion of the pixel electrode 111, high step coverage can be obtained as compared with the case where an inorganic insulating film is used; therefore, an influence of the shape of the pixel electrode 111 can be small. Therefore, a short circuit in the light-emitting element can be prevented.

Either a side-by-side method or a color filter method may be employed in the display panel. In the case of the color filter method, a combination with a light-emitting element with white light emission is preferable. FIG. 1(D) and the like illustrate an example in which the EL layer 112 is provided for each light-emitting element, whereas FIG. 4(B) illustrates an example in which the EL layer 112 is provided for a plurality of light-emitting elements. The light emission of each light-emitting element can be extracted through a coloring layer. FIG. 4(B) illustrates an example in which light emission of the light-emitting element 110a is extracted through a coloring layer 131A for a first color and light emission of the light-emitting element 110b is extracted through a coloring layer 131B for a second color. Note that a color filter can also be used in the case where the EL layer 112 is provided for each light-emitting element.

The coloring layer is a colored layer that transmits light in a specific wavelength range. For example, a color filter that transmits light in a red, green, blue, or yellow wavelength range can be used. As a material that can be used for the coloring layer, a metal material, a resin material, a resin material containing a pigment or dye, and the like can be given.

As illustrated in FIG. 4(C), the common electrode 113a may be provided in the entire light-emitting region of the light-emitting element 110b. In that case, the entire light-emitting region of the light-emitting element 110b emits light to the substrate 101 side (this structure can also be referred to as a bottom-emission structure).

Specific Example 2 of Display Panel

Figure 6:
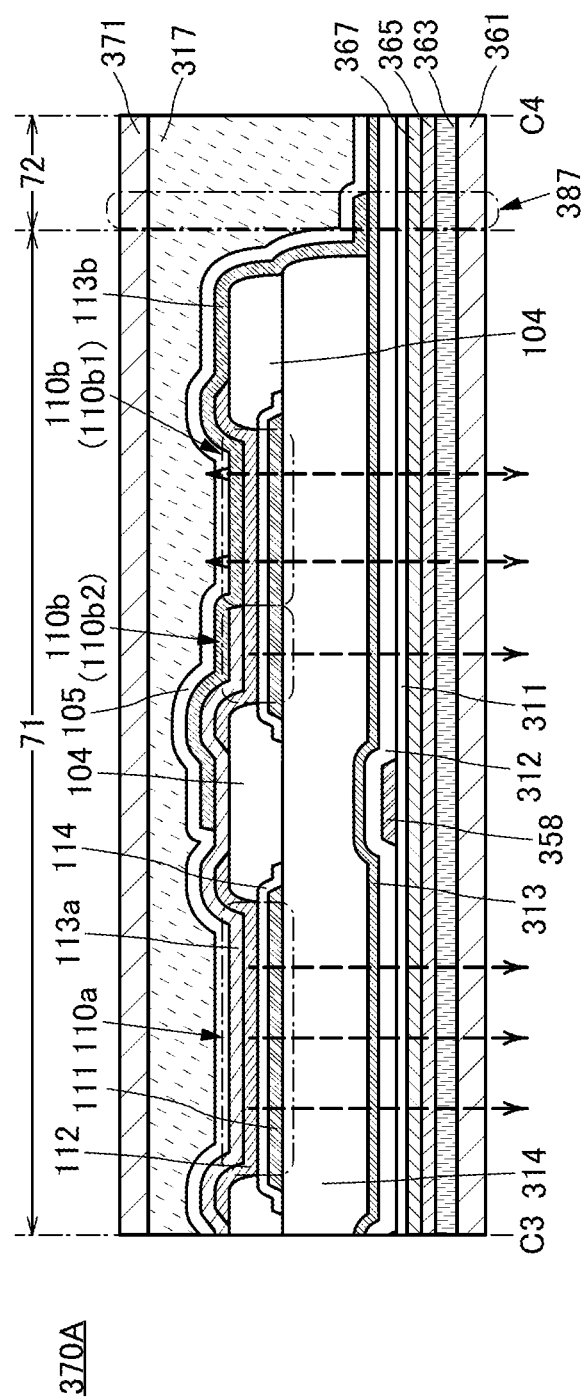
FIG. 6 A cross-sectional view illustrating an example of a display panel.

FIGS. 5(A) and 5(B) illustrate top views of display panels. FIG. 5(C) illustrates a cross-sectional view along dashed-dotted line C1-C2 in FIG. 5(A). FIG. 6 illustrates a cross-sectional view along dashed-dotted line C3-C4 in FIG. 5(A).

The display panels illustrated in FIGS. 5(A) and 5(B) each include the display region 71, the visible-light-transmitting region 72, and a driver circuit 78. The FPC 74 is connected to the display panel. FIGS. 5(A) and 5(B) each illustrate an example in which the visible-light-transmitting region 72 is adjacent to the display region 71 and positioned along two sides of the display region 71. Furthermore, in the examples in FIGS. 5(A) and 5(B), the driver circuit 78 is positioned along the other two sides of the display region 71.

The display panel illustrated in FIG. 5(A) has a sharp corner and the display panel illustrated in FIG. 5(B) has a rounded corner. A display panel using a film substrate can be manufactured to have any of various top surface shapes. For example, a display panel with a corner having a curvature is easily manufactured in some cases because the display panel is less likely to be cracked when divided.

As illustrated in FIG. 5(C) and FIG. 6, a display panel 370A includes a substrate 361, a bonding layer 363, insulating layers 365 and 367, transistors 301 and 303, conductive layers 307, 355, and 358, an insulating layer 314, the light-emitting element 110a, the light-emitting element 110b, the insulating layer 104, the protective layer 105, a bonding layer 317, a substrate 371, and the like.

The display panel 370A is a bottom-emission display panel employing a side-by-side method.

The light-emitting element 110a includes the pixel electrode 111, the EL layer 112, and the common electrode 113a. The light-emitting element 110b includes the pixel electrode 111, the EL layer 112, and the common electrode 113b. The pixel electrode 111 is electrically connected to a source or a drain of the transistor 303. These are connected directly or connected through another conductive layer. The EL layer 112 is provided for each light-emitting element. The common electrode 113a and the common electrode 113b each cover the end portion of the EL layer 112 and are in contact with the insulating layer 104 outside the end portion of the EL layer 112. The common electrode 113b includes a portion in contact with the common electrode 113a.

The pixel electrode 111 has a function of transmitting visible light. The common electrode 113a has a function of reflecting visible light. The light-emitting element 110a emits light to the substrate 101 side.

The common electrode 113b has a function of transmitting visible light. The common electrode 113a is provided in part (part 110b2) of the light-emitting element 110b. The part 110b2 of the light-emitting element 110b emits light to the substrate 101 side. Another part 110b1 of the light-emitting element 110b emits light to both the substrate 101 side and the protective layer 105 side.

In the vicinity of a connection portion 306 of the display panel 370A, an opening 308 reaching the insulating layer 313 is provided in the insulating layer 314, and the insulating layer 313 and the protective layer 105 are in contact with each other in the opening 308. Even in the case where an organic insulating film exists in an end portion of the display panel as described above, the organic insulating film has an opening and inorganic films (or inorganic insulating films) are in contact with each other in the opening, whereby impurities such as moisture are less likely to enter the display panel from the outside of the display panel; thus, deterioration of the transistor and the light-emitting element can be suppressed. In the display region 71 of the display panel 370A, the protective layer 105 covers an end portion of the insulating layer 314 and an end portion of the insulating layer 104 in the vicinity of the visible-light-transmitting region 72. Furthermore, the protective layer 105 is in contact with the insulating layer 313 outside the end portion of the insulating layer 314 and the end portion of the insulating layer 104. With such a structure, impurities such as moisture are less likely to enter the display panel from the outside of the display panel, whereby deterioration of the transistor and the light-emitting element can be suppressed.

As illustrated in FIG. 6, the light-emitting element 110b using the common electrode 113b is provided between the light-emitting element 110a using the common electrode 113a and the visible-light-transmitting region 72. Thus, even when the common electrode 113a is formed in an area wider than a desired region due to bending of a metal mask, the common electrode 113a can be inhibited from extending to the visible-light-transmitting region 72. For this reason, the light-transmitting property of the common electrode 113a is not limited, and a metal, an alloy, or the like having low resistivity can be used. Accordingly, a voltage drop due to the resistance of the common electrode 113a can be suppressed and the display quality can be increased.

Even when the common electrode 113b extends to the visible-light-transmitting region 72 due to bending of a metal mask, a reduction in light-transmitting property of the visible-light-transmitting region 72 can be inhibited because the common electrode 113b has a function of transmitting visible light. Specifically, in the visible-light-transmitting region 72, a difference in light-transmitting property can be narrowed between a region 387 illustrated in FIG. 6 and other regions. Thus, when the visible-light-transmitting region 72 overlaps with a display region of another display panel, a difference in light extraction efficiency is not easily made and display unevenness can be inhibited. In addition, light emitted from a light-emitting element can be taken out sufficiently also in the region 387 when the region 387 overlaps with a display region of another display panel, and a seam between the two display panels cannot be easily recognized. Consequently, the display quality of the display device can be increased.

Figure 7A:
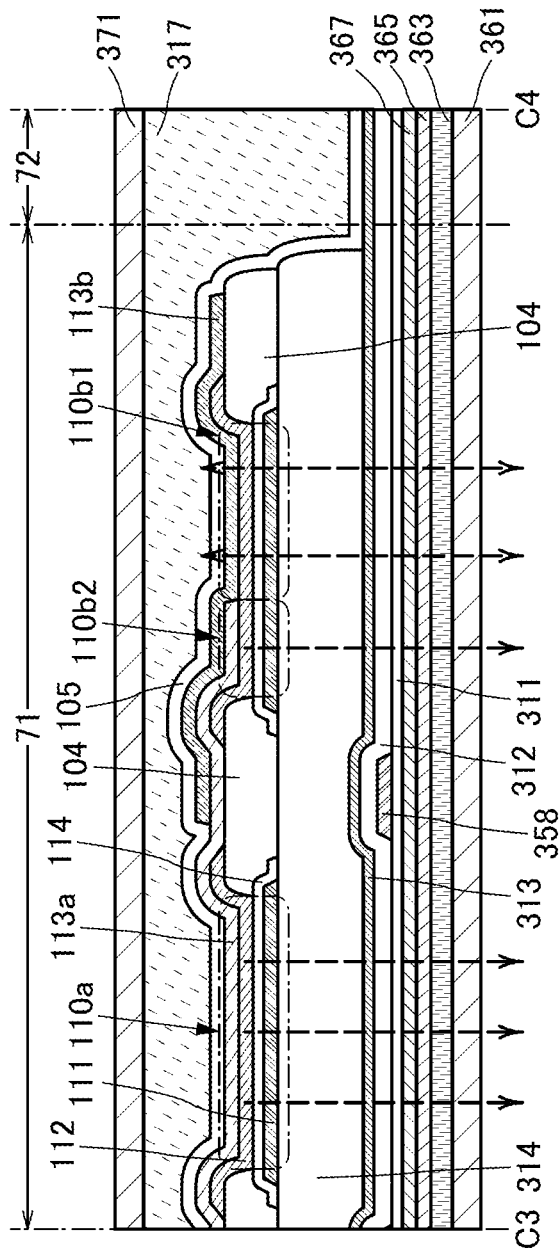
FIGS. 7A and 7B Cross-sectional views each illustrating an example of a display panel.

The common electrode can be formed in a desired region in some cases such as the case where the degree of bending of a metal mask is small. For example, like a display panel 370B illustrated in FIG. 7(A), a structure in which the common electrode 113b does not extend to the visible-light-transmitting region 72 and the end portion of the common electrode 113b is included in the display region 71 is also one embodiment of the present invention. FIG. 7(A) illustrates an example in which the end portion of the common electrode 113b is positioned over the insulating layer 104.

Figure 7B:
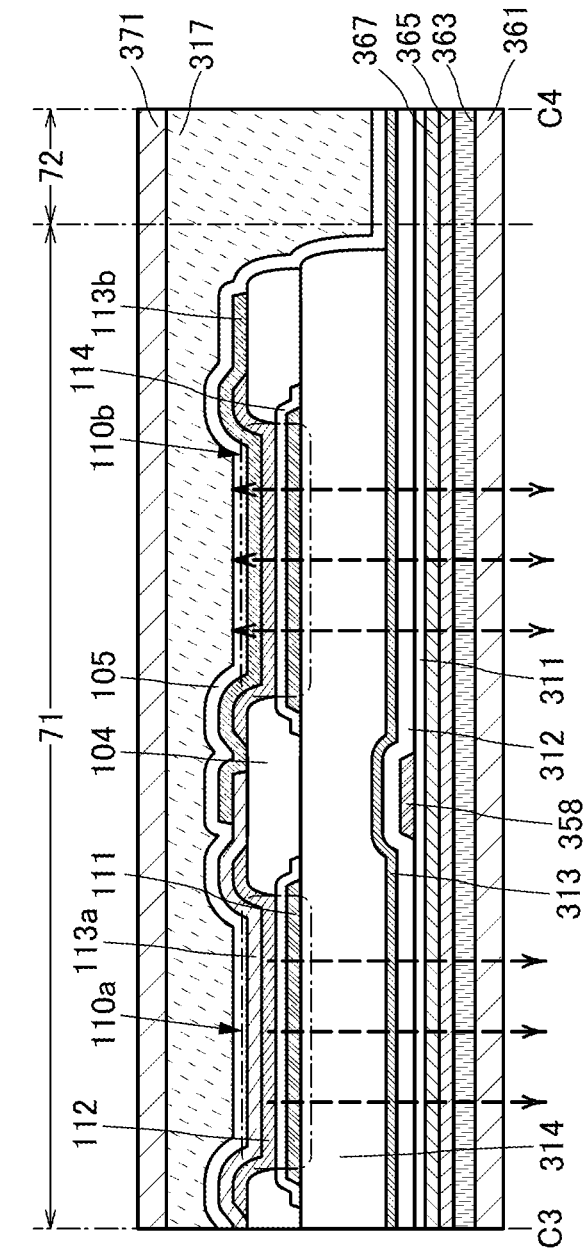

Furthermore, like a display panel 370C illustrated in FIG. 7(B), a structure in which the common electrode 113a does not overlap with the light-emitting region of the light-emitting element 110b is also one embodiment of the present invention. In this structure, the whole light-emitting region of the light-emitting element 110b emits light to both the substrate 101 side and the protective layer 105 side. FIG. 7(B) illustrates an example in which the end portion of the common electrode 113a and the end portion of the common electrode 113b are each positioned over the insulating layer 104.

Each of the light-emitting element 110a and the light-emitting element 110b further includes an optical adjustment layer 114. When the light-emitting element has a microcavity structure, light with high color purity can be extracted from the display panel.

The insulating layer 104 covers the end portion of the pixel electrode 111 and an end portion of the optical adjustment layer 114. Two adjacent pixel electrodes 111 are electrically insulated from each other by the insulating layer 104.

In the display region 71 of each of the display panels 370B and 370C illustrated in FIGS. 7(A) and 7(B), in the vicinity of the visible-light-transmitting region 72, the protective layer 105 covers the end portion of the common electrode 113a and the end portion of the common electrode 113b, and is in contact with the insulating layer 104 outside the end portion of the common electrode 113a and the end portion of the common electrode 113b. Furthermore, the protective layer 105 covers the end portion of the insulating layer 314 and the end portion of the insulating layer 104 and is in contact with the insulating layer 313 outside the end portion of the insulating layer 314 and the end portion of the insulating layer 104. With such a structure, entry of impurities into the common electrode 113a and the common electrode 113b can be inhibited.

In the display panel of this embodiment, it is preferable that the variety of insulating layers and the protective layer 105 be provided such that an end portion of an inorganic film (or an inorganic insulating film) is positioned outside an end portion of an organic film and inorganic films (or inorganic insulating films) be stacked to be in contact with each other at and in the vicinity of the end portion of the display panel.

The substrate 361 and the substrate 371 are attached to each other with the bonding layer 317. The substrate 361 and the insulating layer 365 are attached to each other with the bonding layer 363.

The display panel 370A has a structure in which the transistor, the light-emitting element 110a, the light-emitting element 110b, and the like formed over a formation substrate are transferred to the substrate 361.

For the substrate 361 and the substrate 371, a material such as glass, quartz, a resin, a metal, an alloy, or a semiconductor can be used. The substrate on the side where light from the light-emitting element is extracted is formed using a material that transmits the light. A flexible substrate is preferably used as the substrate 361 and the substrate 371.

For the bonding layer, various curable adhesives, e.g., a photocurable adhesive such as an ultraviolet curable adhesive, a reactive curable adhesive, a thermosetting adhesive, and an anaerobic adhesive, can be used. Alternatively, an adhesive sheet or the like may be used.

The driver circuit 78 includes the transistor 301. The display region 71 includes the transistor 303.

Each transistor includes a gate, a gate insulating layer 311, a semiconductor layer, a back gate, a source, and a drain. The gate (the lower gate) and the semiconductor layer overlap with each other with the gate insulating layer 311 therebetween. The back gate (the upper gate) and the semiconductor layer overlap with each other with an insulating layer 312 and the insulating layer 313 therebetween. It is preferable that the two gates be electrically connected to each other.

The structure of the transistor may be different between the driver circuit 78 and the display region 71. The driver circuit 78 and the display region 71 may each include a plurality of kinds of transistors.

A material through which impurities such as water and hydrogen do not easily diffuse is preferably used for at least one of the insulating layer 365, the insulating layer 367, the insulating layer 312, the insulating layer 313, and the insulating layer 314. Diffusion of impurities from the outside into the transistors can be effectively inhibited, leading to improved reliability of the display panel. The insulating layer 314 functions as a planarization layer.

The display region 71 includes the conductive layer 358. The conductive layer 358 is an example of wirings in the pixel. The connection portion 306 includes the conductive layer 307. The conductive layer 307 is electrically connected to an external input terminal through which a signal or a potential from the outside is transmitted to the driver circuit 78. Here, an example in which the FPC 74 is provided as an external input terminal is shown. The FPC 74 and the conductive layer 307 are electrically connected to each other through a connector 319. The conductive layer 307 and the conductive layer 358 can be formed using the same material and the same step as those of the source and the drain of the transistor.

As the connector 319, any of various anisotropic conductive films (ACF), anisotropic conductive pastes (ACP), and the like can be used.

Figure 8:
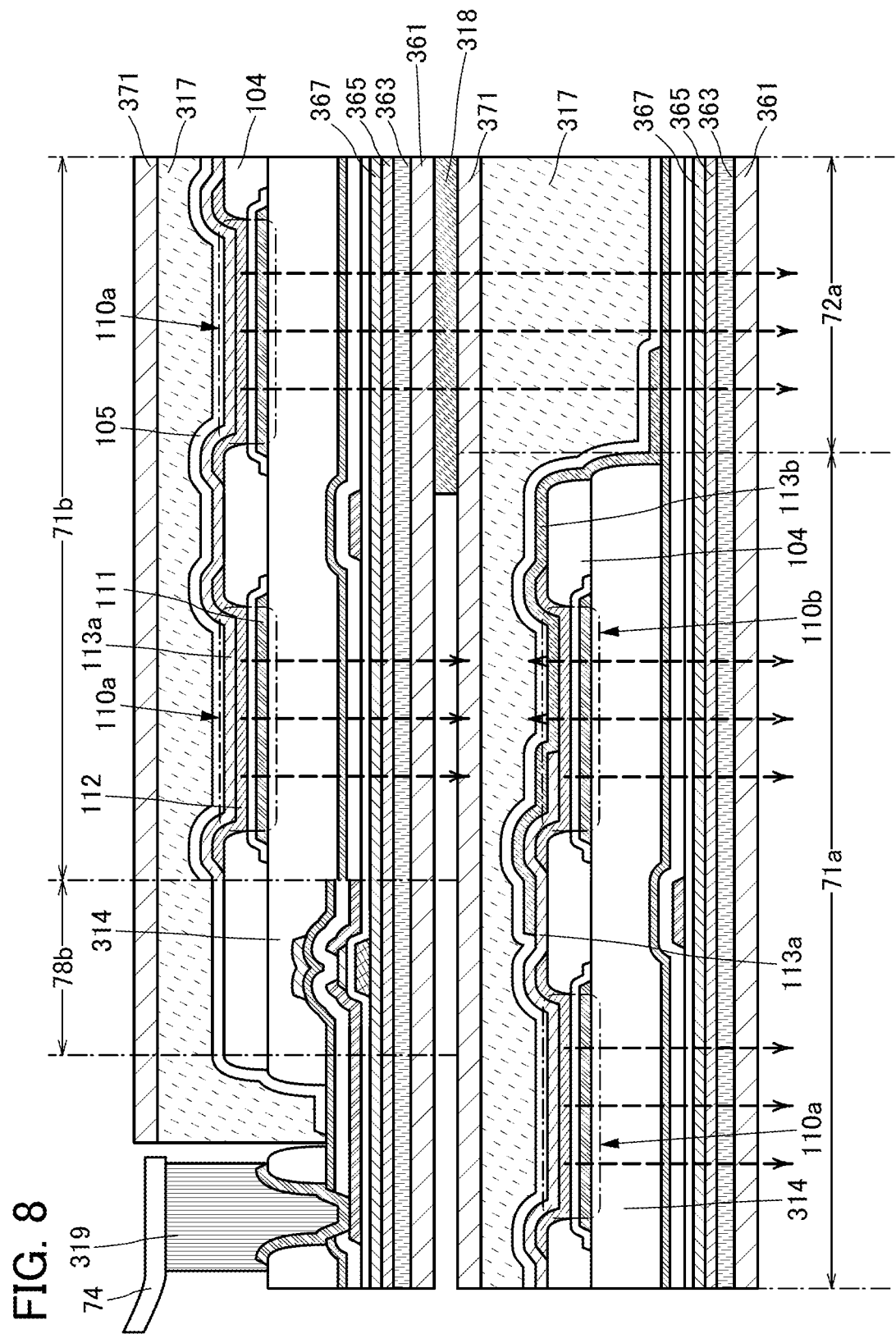
FIG. 8 A cross-sectional view illustrating an arrangement example of display panels.

FIG. 8 illustrates an example in which two display panels 370A are provided to overlap with each other.

FIG. 8 illustrates a display region 71a and a visible-light-transmitting region 72a of the lower display panel and a display region 71b and a driver circuit 78b of the upper display panel.

In FIG. 8, the display panel positioned on the display surface side (lower side) includes the visible-light-transmitting region 72a adjacent to the display region 71a. The display region 71b of the upper display panel overlaps with the visible-light-transmitting region 72a of the lower display panel. Thus, a non-display region between the display regions of the two overlapping display panels can be reduced and even removed. Accordingly, a large display device in which a seam between display panels is not easily recognized by a user can be obtained.

Furthermore, the display region 71b also overlaps with the light-emitting region of the light-emitting element 110b included in the lower display panel. Since light from the light-emitting element 110b is emitted to the protective layer 105 side in some cases, variation in luminance might be caused between display performed with the light-emitting element 110a and display performed with the light-emitting element 110b in the lower display panel. Thus, it is preferable that the light-emitting element 110b included in the display region 71a overlap with the light-emitting element 110a included in the display region 71b and that display is performed with the light-emitting element 110a. As illustrated in FIG. 8, display may be performed with both the light-emitting element 110b included in the display region 71a and the light-emitting element 110a included in the display region 71b, or the light-emitting element 110b may be brought into a non-light-emitting state. Note that when light emitted from the light-emitting element 110b is reflected by the common electrode 113a included in the display region 71b, the light can be extracted to the outside of the display panel in some cases.

Here, it is preferable that video signals corrected so that discontinuation of an image at the seam between the two display panels can be reduced be input to the display panels. As a result, a natural image having a sense of unity, in which the seam is not easily recognized, can be displayed.

In particular, it is preferable to correct the video signals using artificial intelligence (AI).

Note that artificial intelligence refers to a computer that imitates the intelligence of human beings. For example, the video signals can be corrected using an artificial neural network (ANN). The artificial neural network refers to a circuit that imitates a neural network composed of neurons and synapses, and the artificial neural network is a kind of artificial intelligence.

The display panel of this embodiment can be used for a display portion of a display system (FIG. 15) described below. The display system includes a signal generation portion and the display portion. The signal generation portion can correct image data. The display panels of this embodiment can display a natural image having a sense of unity, in which a seam is not easily recognized, by displaying the image using corrected image data.

As illustrated in FIG. 8, the two display panels overlap with each other with a light-transmitting layer 318 therebetween. Specifically, the light-transmitting layer 318 that has a higher refractive index than air and transmits visible light is provided between the visible-light-transmitting region 72a and the display region 71b. Thus, air can be inhibited from entering a portion between the visible-light-transmitting region 72a and the display region 71b, so that the interface reflection due to a difference in refractive index can be reduced. In addition, display unevenness or luminance unevenness of the display device can be suppressed.

The light-transmitting layer 318 can overlap with part or the whole of a surface of the substrate 371 of the lower display panel. Furthermore, the light-transmitting layer 318 can overlap with part or the whole of a surface of the substrate 361 of the upper display panel. For example, the light-transmitting layer 318 may overlap with only the visible-light-transmitting region 72a and the display region 71b. The light-transmitting layer 318 may overlap with the driver circuit 78b.

Next, specific examples of the display panel of one embodiment of the present invention, which are different from the display panels 370A, 370B, and 370C, will be described with reference to FIG. 9 and FIG. 10.

Figure 10A:
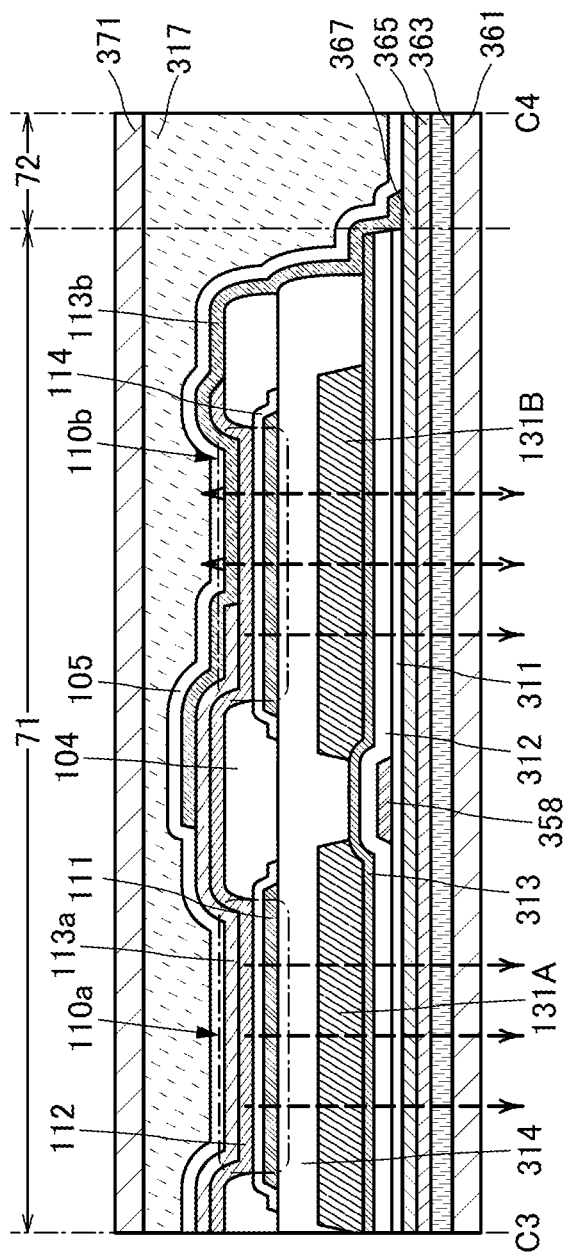
FIGS. 10A and 10B Cross-sectional views each illustrating an example of a display panel.
Figure 10B:
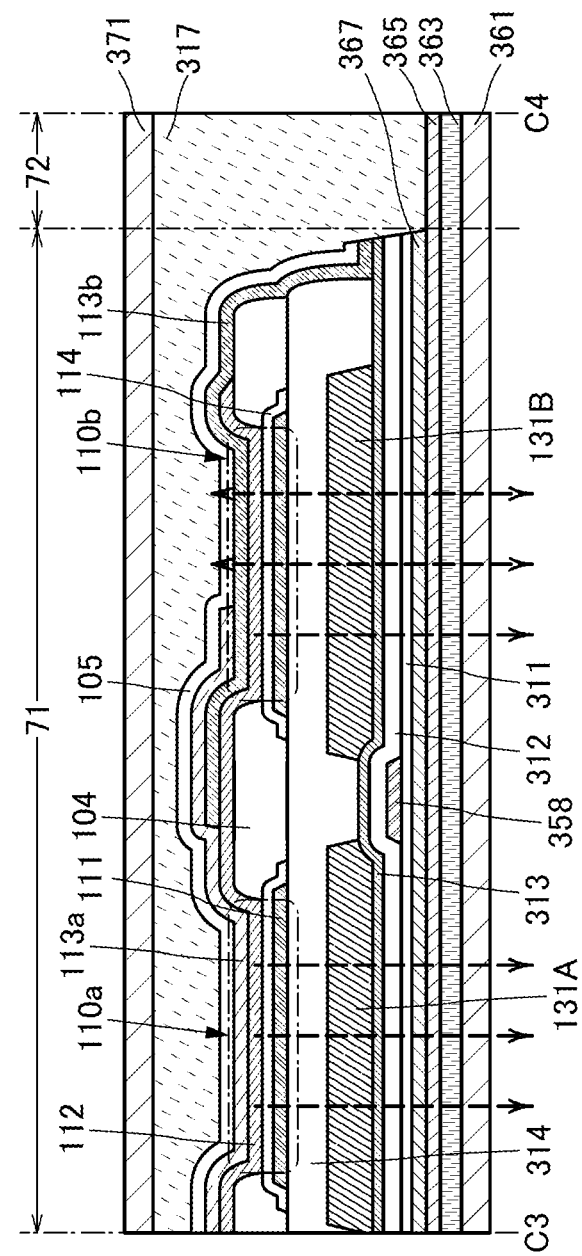

FIG. 9(A) and FIG. 10(A) are cross-sectional views of a display panel 370D. FIG. 9(B) and FIG. 10(B) are cross-sectional views of a display panel 370E. FIGS. 9(A) and 9(B) correspond to cross-sectional views along dashed-dotted line C1-C2 in FIG. 5(A). FIGS. 10(A) and 10(B) correspond to cross-sectional views along dashed-dotted line C3-C4 in FIG. 5(A).

The display panels 370D and 370E are different from the display panel 370A in that a coloring layer is provided between the insulating layer 315 and the insulating layer 314 covering the transistors and the EL layer 112 is provided for a plurality of pixels. Description of portions in common with the display panel 370A is omitted.

Although the display panel 370A employing a side-by-side method is described as an example, a color filter method can also be employed as in the display panels 370D and 370E.

The layers included in the visible-light-transmitting region 72 transmit visible light. The display panel 370A illustrated in FIG. 6 illustrates an example in which the visible-light-transmitting region 72 includes the substrate 361, the bonding layer 363, the insulating layer 365, the insulating layer 367, the gate insulating layer 311, the insulating layer 312, the insulating layer 313, the protective layer 105, the bonding layer 317, and the substrate 371. In this stacked-layer structure, the materials for the layers are preferably selected such that a difference in refractive index at each interface is reduced. By reducing a difference in refractive index between two layers that are in contact with each other, a seam between the two display panels is not easily recognized by a user.

As in each of the display panel 370D illustrated in FIG. 10(A) and the display panel 370E illustrated in FIG. 10(B), the number of insulating layers included in the visible-light-transmitting region 72 is preferably smaller than that of insulating layers included in a portion, which is in the vicinity of the visible-light-transmitting region 72, of the display region 71.

Unlike the display panel 370A, the display panel 370D has a structure in which the visible-light-transmitting region 72 does not include the gate insulating layer 311, the insulating layer 312, and the insulating layer 313.

Unlike the display panel 370A, the display panel 370E has a structure in which the visible-light-transmitting region 72 does not include the insulating layer 367, the gate insulating layer 311, the insulating layer 312, the insulating layer 313, and the protective layer 105.

The number of insulating layers included in the visible-light-transmitting region 72 is reduced, and thus the number of interfaces at which a difference in refractive index is large can be reduced. In this manner, the reflection of external light in the visible-light-transmitting region 72 can be suppressed. Moreover, the visible light transmittance in the visible-light-transmitting region 72 can be increased. Accordingly, a difference in luminance (brightness) of display on the display panel provided on the lower side between a portion seen through the visible-light-transmitting region 72 and a portion seen not through the region can be made small. Accordingly, display unevenness or luminance unevenness of the display device can be suppressed.

The display panel 370E has a structure in which part of the transistor 303 included in the display region 71 transmits visible light. Specifically, one of the source and the drain (a conductive layer 203t), the two gate electrodes, and the semiconductor layer of the transistor 303 transmit visible light.

As described above, with the structure in which at least part of the transistor included in the display region 71 transmits visible light, at least the part of the transistor can be provided to overlap with the light-emitting region of the light-emitting element, and the aperture ratio of the display region 71 can be increased. Furthermore, when the capacitor and the like included in the display region 71 also transmit visible light and are provided to overlap with the light-emitting region of the light-emitting element, the aperture ratio of the display region 71 can be further increased.

Note that a coloring layer is not provided in a contact portion between the other of the source and the drain (a conductive layer 203s) of the transistor 303 and the pixel electrode 111. Therefore, when the conductive layer 203s transmits visible light, light emitted from the light-emitting element 110a might leak to the outside of the display panel without passing through the coloring layer. Thus, a conductive film such as a metal film or an alloy film that blocks visible light is preferably used as the conductive layer 203s.

In the display region 71, a conductive film such as a metal film or an alloy film that blocks visible light is preferably used as a scan line and a signal line. With the use of a metal film, an alloy film, or the like as the scan line and the signal line, the resistance value of the scan line and the signal line can be reduced. A metal film, an alloy film, or the like is also used for the transistor, a wiring, and the like in the driver circuit 78. The scan line and the signal line are preferably formed in the same process as the transistor 301, the wiring, and the like in the driver circuit 78. For example, the conductive layer 358 can function as the scan line or the signal line. For example, a metal film, an alloy film, or the like is preferably used as each of the conductive layer 358, and a conductive layer 201a and the conductive layer 203s included in the driver circuit 78.

The gate is preferably formed using a multi-tone mask (a halftone mask, a gray-tone mask, or the like). When a multi-tone mask is used, without increasing the number of masks, a gate that transmits visible light can be formed in the display region 71, and a low-resistance gate and a low-resistance gate wiring can be formed in the driver circuit 78. The conductive layer 203s and the conductive layer 203t are also preferably formed using a multi-tone mask (a halftone mask, a gray-tone mask, or the like). Note that the conductive layer 203s may have a stacked-layer structure of the conductive layer 203t (a visible-light-transmitting conductive film), and a metal film, an alloy film, or the like.

Examples of a material of the visible-light-transmitting semiconductor film include a metal oxide and an oxide semiconductor. The oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

A material of the visible-light-transmitting conductive film preferably includes one kind or a plurality of kinds selected from indium, zinc, and tin. Specifically, an In oxide, an In—Sn oxide (also referred to as ITO: Indium Tin Oxide), an In—Zn oxide, an In—W oxide, an In—W—Zn oxide, an In—Ti oxide, an In—Sn—Ti oxide, an In—Sn—Si oxide, a Zn oxide, a Ga—Zn oxide, or the like can be used.

As the material of the conductive film included in the transistor, an oxide semiconductor that contains an impurity element, for example, and has reduced resistance may be used. The oxide semiconductor with reduced resistance can be regarded as an oxide conductor (OC).

For example, regarding an oxide conductor, oxygen vacancies are formed in an oxide semiconductor and then hydrogen is added to the oxygen vacancies, so that a donor level is formed in the vicinity of the conduction band. By the formation of the donor level in the oxide semiconductor, the oxide semiconductor has an increased conductivity and becomes a conductor.

An oxide semiconductor has a large energy gap (e.g., an energy gap of 2.5 eV or larger), and thus has a visible-light-transmitting property. An oxide conductor is an oxide semiconductor having a donor level in the vicinity of the conduction band, as described above. Therefore, the influence of absorption due to the donor level is small in the oxide conductor, and the oxide conductor has a visible-light-transmitting property comparable to that of an oxide semiconductor.

The oxide conductor preferably includes one or more kinds of metal elements included in the semiconductor film of the transistor. When oxide semiconductors including the same metal element are used for two or more layers of the layers constituting the transistor, the same manufacturing apparatus (e.g., deposition apparatus or processing apparatus) can be used in two or more steps and manufacturing cost can thus be reduced.

Specific Example 3 of Display Panel

Figure 11A:
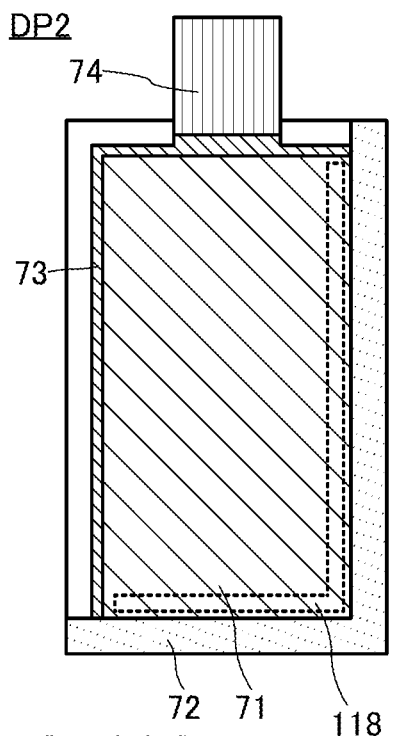
FIGS. 11A to 11D Top views and cross-sectional views illustrating examples of display panels.

FIG. 11(A) illustrates a top view of a display panel DP2.

The display panel DP2 illustrated in FIG. 11(A) includes the display region 71, the visible-light-transmitting region 72, and the visible-light-blocking region 73. The visible-light-transmitting region 72 and the visible-light-blocking region 73 are each provided adjacent to the display region 71. FIG. 11(A) illustrates an example in which the display panel DP2 is provided with the FPC 74.

A partition wall 118 is provided in the display region 71 of the display panel DP2. The partition wall 118 is provided along the visible-light-transmitting region 72. In FIG. 11(A), the visible-light-transmitting region 72 is provided along two consecutive sides of the display region 71; thus, the partition wall 118 is also provided along the two sides.

The display panel DP2 has a bottom-emission structure. FIG. 11(A) illustrates a surface opposite to a display surface of the display panel DP2.

Figure 11B:
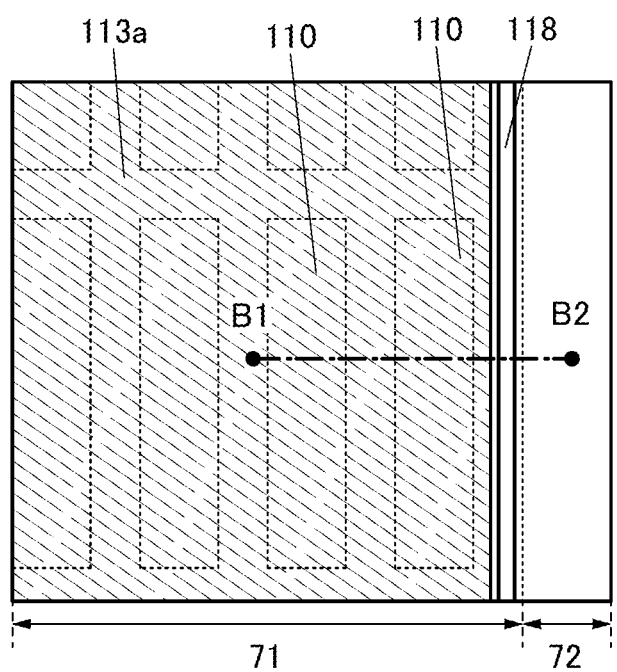
Figure 11C:
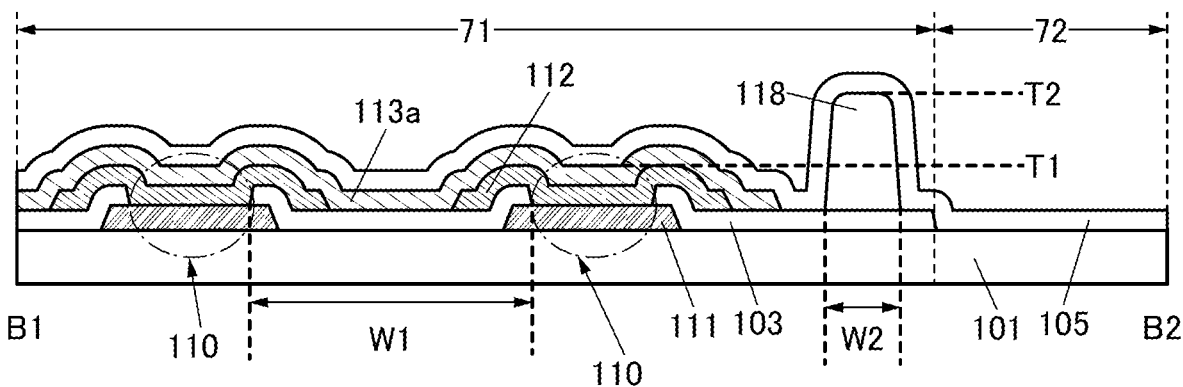
Figure 11D:
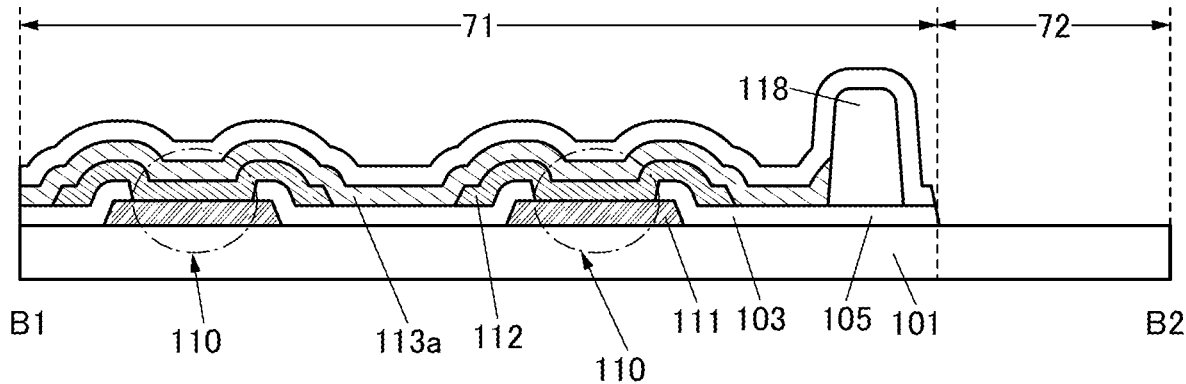

FIG. 11(B) shows an enlarged view of a portion including a boundary between the display region 71 and the visible-light-transmitting region 72 in the display panel DP2. FIGS. 11(C) and 11(D) are each a cross-sectional view along dashed-dotted line B1-B2 in FIG. 11(B).

The display panels illustrated in FIGS. 11(C) and 11(D) each include the substrate 101, the light-emitting element 110, the partition wall 118, the insulating layer 103, and the protective layer 105.

The light-emitting element 110 includes the pixel electrode 111, the EL layer 112, and the common electrode 113a. The pixel electrode 111 is provided over the substrate 101, the EL layer 112 is provided over the pixel electrode 111, and the common electrode 113a is provided over the EL layer 112. The pixel electrode 111 has a function of transmitting visible light. The common electrode 113a has a function of reflecting visible light. The light-emitting element 110 emits light to the substrate 101 side.

The partition wall 118 is provided over the insulating layer 103. A level T2 of a top surface of the partition wall 118 is higher than a level T1 of a top surface of the common electrode 113a in the light-emitting region of the light-emitting element 110. A width W2 of the partition wall 118 is smaller than a width W1 between the two light-emitting elements 110. When the width W2 is larger than the width W1, the pixel pitch might deviate when two display panels overlap with each other, leading to a decrease in display quality in some cases. The partition wall 118 is preferably provided such that a pixel pitch does not deviate at a seam between two display panels.

When a metal mask is in contact with the partition wall 118 in the formation of the common electrode 113a, the common electrode 113a can be prevented from protruding into the visible-light-transmitting region 72. Thus, the common electrode 113a can be formed such that the end portion of the common electrode 113a is positioned inside the partition wall 118 (see FIGS. 11(B) to 11(D)). Since the common electrode 113a does not extend to the visible-light-transmitting region 72 and can be formed in a desired region, the display quality of the display device can be improved. Note that the common electrode 113a is sometimes in contact with the partition wall 118 due to pattern blurring at the deposition or the like, as illustrated in FIG. 11(D).

It is preferable that the protective layer 105 cover the end portion of the common electrode 113a and be in contact with the insulating layer 103 outside the end portion of the common electrode 113a. FIG. 11(C) illustrates an example in which the protective layer 105 extends to the visible-light-transmitting region 72, and FIG. 11(D) illustrates an example in which the protective layer 105 is not provided in the visible-light-transmitting region 72.

Specific Example 4 of Display Panel

Figure 12A:
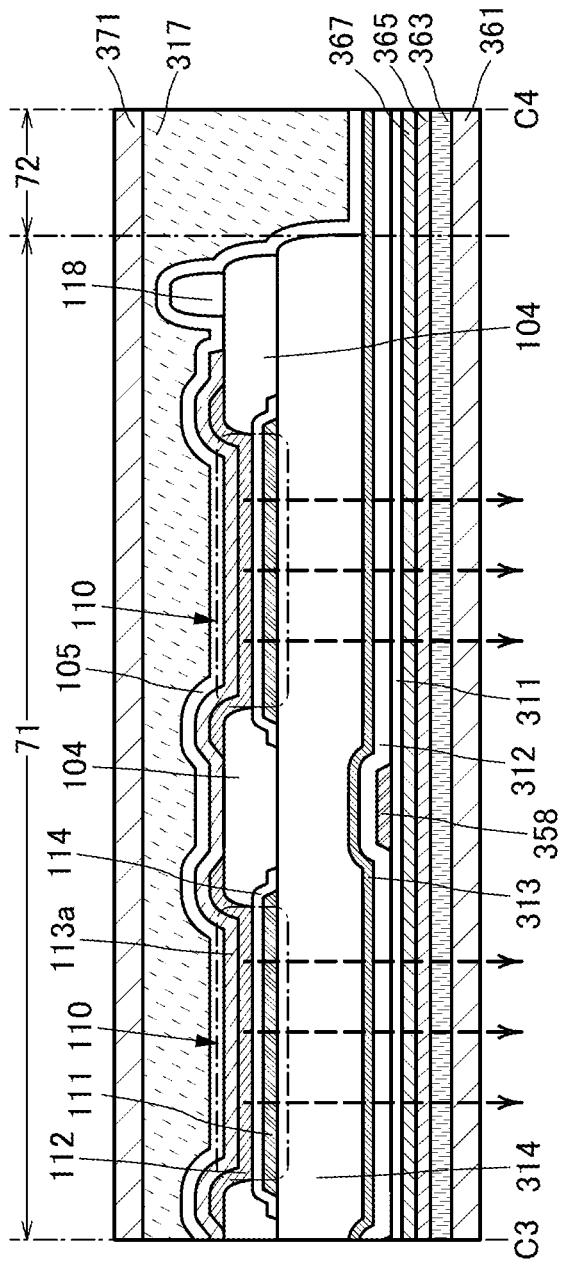
FIGS. 12A and 12B Cross-sectional views each illustrating an example of a display panel.
Figure 12B:
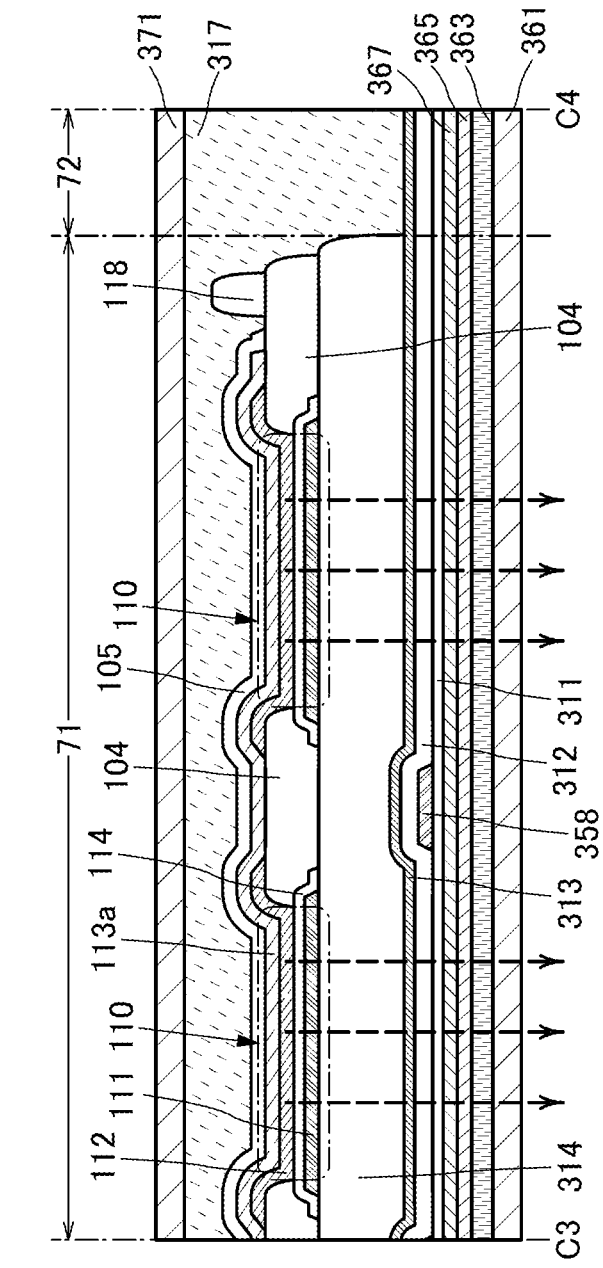

FIG. 12(A) is a cross-sectional view of a display panel 370F. FIG. 12(B) is a cross-sectional view of a display panel 370G. FIGS. 12(A) and 12(B) correspond to cross-sectional views along dashed-dotted line C3-C4 in FIG. 5(A). Description of portions in common with the display panel 370A is omitted.

As illustrated in FIGS. 12(A) and 12(B), the display panels 370F and 370G each include the substrate 361, the bonding layer 363, the insulating layers 365 and 367, the conductive layer 358, the insulating layer 314, the light-emitting element 110, the insulating layer 104, the protective layer 105, the partition wall 118, the bonding layer 317, the substrate 371, and the like.

The light-emitting element 110 includes the pixel electrode 111, the EL layer 112, and the common electrode 113a. The pixel electrode 111 is provided over the insulating layer 314, the EL layer 112 is provided over the pixel electrode 111, and the common electrode 113a is provided over the EL layer 112. The pixel electrode 111 has a function of transmitting visible light. The common electrode 113a has a function of reflecting visible light. The light-emitting element 110 emits light to the substrate 361 side.

The partition wall 118 is provided over the insulating layer 104. The level of the top surface of the partition wall 118 is higher than the level of the top surface of the common electrode 113a in the light-emitting region of the light-emitting element 110.

When a metal mask is in contact with the partition wall 118 in the formation of the common electrode 113a, the common electrode 113a can be prevented from protruding into the visible-light-transmitting region 72. Thus, the common electrode 113a can be formed such that the end portion of the common electrode 113a is positioned inside the partition wall 118 (see FIGS. 12(A) and 12(B)). Since the common electrode 113a does not extend to the visible-light-transmitting region 72 and can be formed in a desired region, the display quality of the display device can be improved.

It is preferable that the protective layer 105 cover the end portion of the common electrode 113a and be in contact with the insulating layer 104 outside the end portion of the common electrode 113a. FIG. 12(A) illustrates an example in which the protective layer 105 extends to the visible-light-transmitting region 72, and FIG. 12(B) illustrates an example in which the protective layer 105 is not provided in the visible-light-transmitting region 72 and the end portion of the protective layer 105 is positioned over the insulating layer 104.

Figure 13:
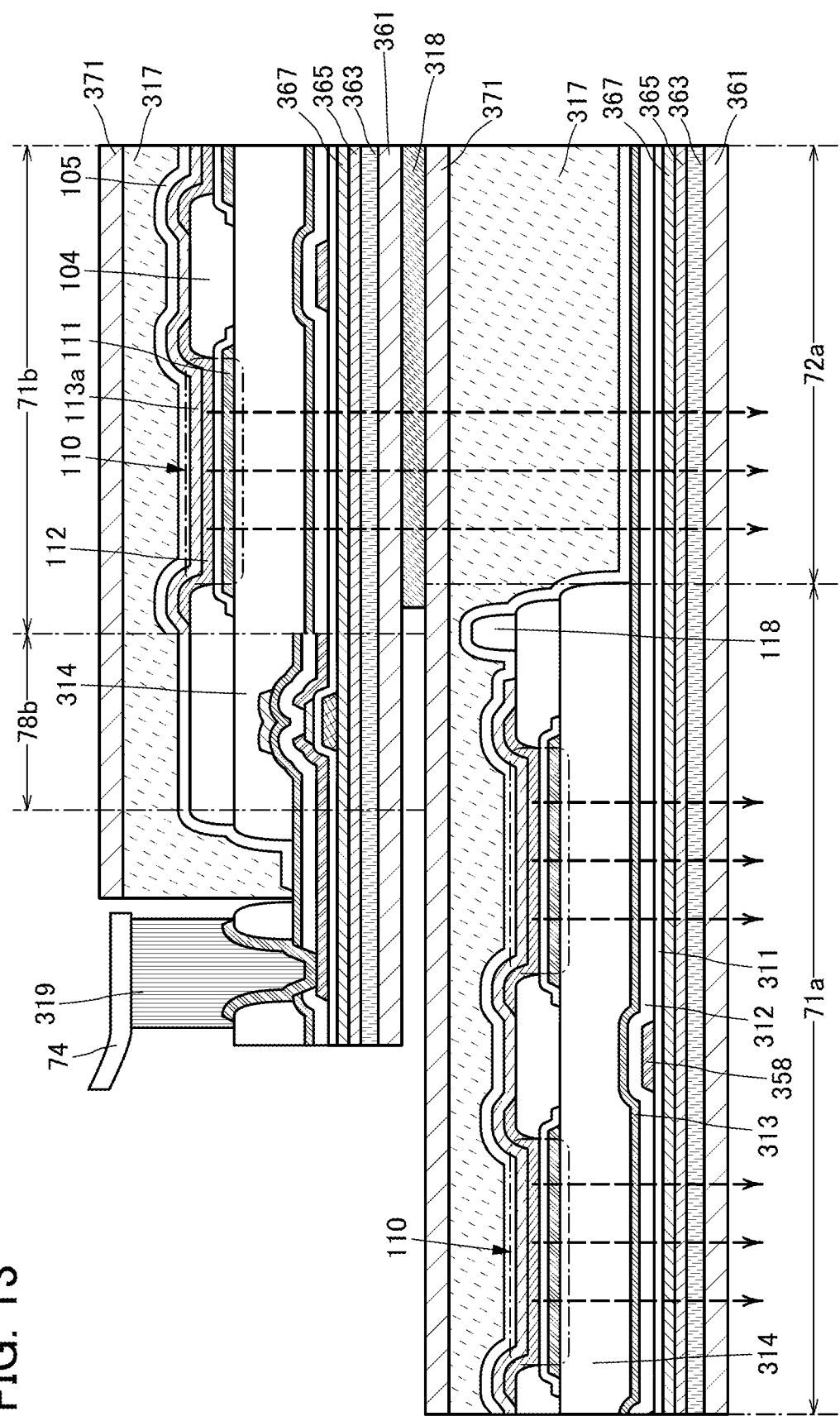
FIG. 13 A cross-sectional view illustrating an arrangement example of display panels.

FIG. 13 illustrates an example in which two display panels 370F are provided to overlap with each other.

FIG. 13 illustrates the display region 71a and the visible-light-transmitting region 72a of the lower display panel and the display region 71b and the driver circuit 78b of the upper display panel.

In FIG. 13, the display panel positioned on the display surface side (lower side) includes the visible-light-transmitting region 72a adjacent to the display region 71a. The display region 71b of the upper display panel overlaps with the visible-light-transmitting region 72a of the lower display panel. Thus, a non-display region between the display regions of the two overlapping display panels can be reduced and even removed. Accordingly, a large display device in which a seam between display panels is not easily recognized by a user can be obtained.

Specific Example of Display Device

Next, a display device including a plurality of display panels will be described with reference to FIG. 14.

Figure 14A:
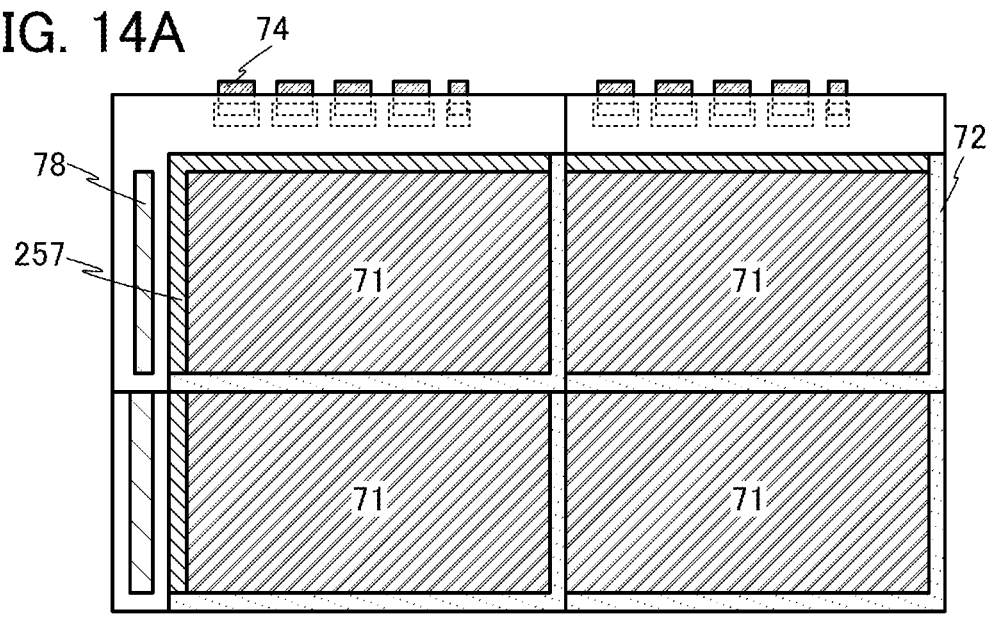
Figure 14B:
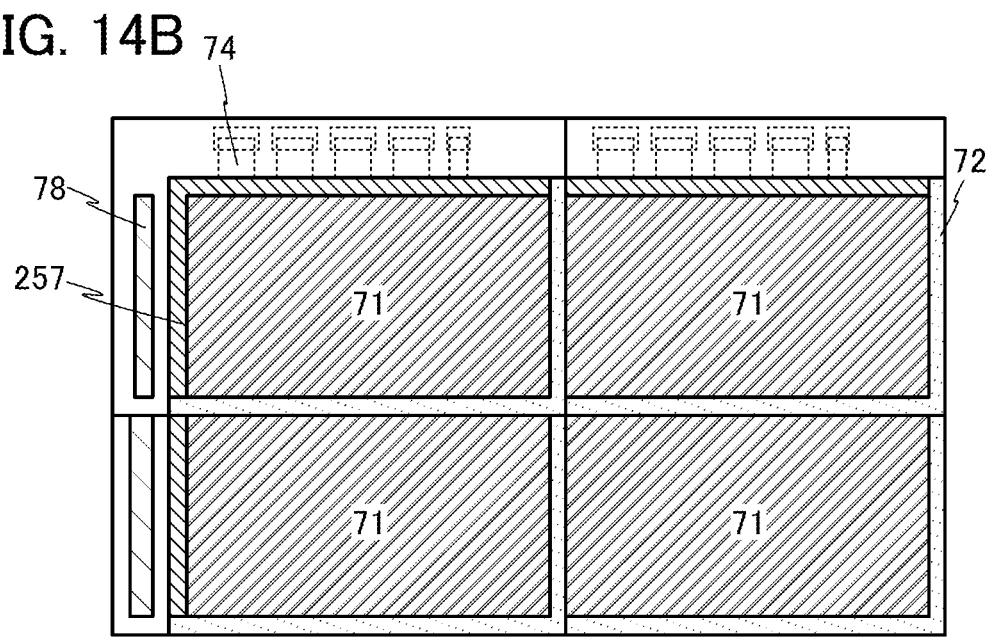

FIGS. 14(A) and 14(B) each illustrate an example in which display panels are arranged in a 2×2 matrix (two display panels in each of the longitudinal direction and the lateral direction).

FIG. 14(A) illustrates an example in which the FPC 74 connected to one display panel is provided to extend outside the display panel.

FIG. 14(B) illustrates an example in which the FPC 74 connected to one display panel is provided to overlap with the display region 71 of the display panel. The FPC can be connected to a surface opposite to the display surface of the display panel of this embodiment. Thus, the size of a display device and the size of an electronic device can be reduced. For example, a space for bending an FPC can be sometimes omitted.

The four display panels are arranged so as to overlap with each other. Specifically, the display panels are arranged such that the visible-light-transmitting region 72 included in one display panel has a region overlapping with and located over the display region 71 (on the display surface side) of another display panel. The display panels are arranged such that the visible-light-blocking region (a lead wiring 257, the driver circuit 78, and the like in FIGS. 14(A) and 14(B)) of one display panel does not overlap with and is not located over the display region of another display panel.

Thus, a region where the four display regions 71 are arranged with almost no seam can be used as the display region of the display device.

Note that to reduce the step between two adjacent display panels, the thicknesses of the display panels are preferably small. For example, the thickness of the display panel is preferably less than or equal to 1 mm, further preferably less than or equal to 300 μm, still further preferably less than or equal to 100 μm.

The display panel preferably incorporates both a scan line driver circuit and a signal line driver circuit. In the case where a driver circuit is provided separately from the display panel, a printed circuit board including a driver circuit and a large number of wirings, terminals, and the like are provided on the back side (the side opposite to the display surface side) of the display panel. Thus, the number of components of the whole display device becomes enormous, which leads to an increase in weight of the display device in some cases. When the display panel incorporates both a scan line driver circuit and a signal line driver circuit, the number of components of the display device can be reduced and the weight of the display device can be reduced. This leads to higher portability of the display device.

Here, the scan line driver circuit and the signal line driver circuit are required to operate at a high driving frequency in accordance with the frame frequency of an image to be displayed. In particular, the signal line driver circuit is required to operate at a higher driving frequency than the scan line driver circuit. Therefore, some transistors used for the signal line driver circuit require large current supply capability in some cases. Meanwhile, some transistors provided in the display region require adequate withstand voltage for driving a display element in some cases.

In view of the above, the transistor of the driver circuit and the transistor of the display region are preferably formed to have different structures. For example, one or a plurality of transistors provided in the display region are transistors with high withstand voltage, and one or a plurality of transistors provided in the driver circuit are transistors with high driving frequency.

Specifically, one or a plurality of transistors used for the signal line driver circuit are transistors each including a thinner gate insulating layer than the transistor used for the display region. By forming two kinds of transistors separately as described above, the signal line driver circuit can be formed over the substrate over which the display region is provided.

One or a plurality of transistors used for the signal line driver circuit are preferably transistors each having a shorter channel length than the transistor used for the display region. For example, the channel length of the transistor of the signal line driver circuit is shorter than 1.5 µm, preferably shorter than or equal to 1.2 µm, further preferably shorter than or equal to 1.0 µm, still further preferably shorter than or equal to 0.9 µm, yet further preferably shorter than or equal to 0.8 µm, yet still further preferably shorter than or equal to 0.6 µm, and preferably longer than or equal to 0.1 µm.

Meanwhile, each transistor provided in the display region preferably has a channel length longer than the shortest channel length among the channel lengths of the transistors of the signal line driver circuit. For example, the channel length of the transistor provided in the display region is longer than or equal to 1 µm, preferably longer than or equal to 1.2 µm, further preferably longer than or equal to 1.4 µm, and shorter than or equal to 20 µm, preferably shorter than or equal to 15 µm, further preferably shorter than or equal to 10 µm.

In each transistor used for the scan line driver circuit, the signal line driver circuit, and the display region, a metal oxide is preferably used for a semiconductor in which a channel is formed. Thus, a signal line driver circuit that is hardly achieved in a display panel using amorphous silicon can be mounted on a display panel, for example. In addition, the display panel can be manufactured with a high yield at low cost because variation in characteristics is small and the area of the display panel can be easily increased as compared with the case of using polycrystalline silicon or the like.

For example, it is preferable to use a transistor 210a described later as the transistor in the display region and to use a transistor 210b described later as the transistor in the driver circuit (see FIGS. 17(A1) and 17(A2)).

Note that in this specification and the like, the channel length direction of a transistor refers to one of directions parallel to the shortest straight line that connects a source and a drain. In other words, the channel length direction corresponds to a direction of current flowing in a semiconductor layer when a transistor is in an on state. The channel width direction refers to a direction orthogonal to the channel length direction. Note that each of the channel length direction and the channel width direction is not fixed to one direction in some cases depending on the structure and the shape of a transistor.

In this specification and the like, the channel length of a transistor refers to, for example, the length in the channel length direction of a region where a semiconductor layer and a gate electrode overlap with each other in a top view or a cross-sectional view of the transistor. The channel width of a transistor refers to the length in the channel width direction of the region.

Note that each of the channel length and the channel width is not fixed to one value in some cases depending on the structure and the shape of a transistor. Thus, in this specification and the like, each of the channel length and the channel width can be the maximum value, the minimum value, the average value, or a given value between the maximum value and the minimum value. Typically, the minimum channel length and the minimum channel width are used.

A transistor may include a pair of gate electrodes (a first gate electrode and a second gate electrode) with a semiconductor layer positioned therebetween depending on its structure. Here, two values corresponding to the gate electrodes can be defined as each of the channel length and the channel width of the transistor. Thus, in this specification and the like, in the case where the term "channel length" is simply used, it represents one or both of a longer channel length and a shorter channel length of the two channel lengths or the average value thereof. Similarly, in this specification and the like, in the case where the term "channel width" is simply used, it represents one or both of a longer channel width and a shorter channel width of the two channel widths or the average value thereof.

Configuration Example of Display System

Figure 15:
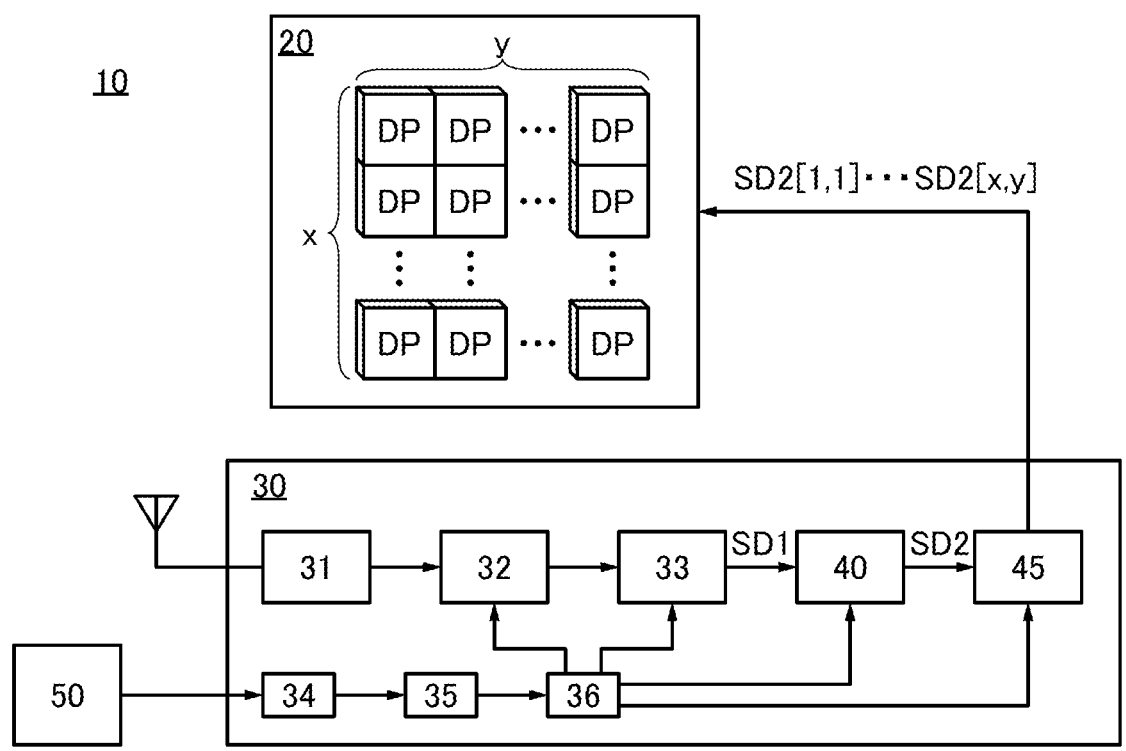
FIG. 15 A diagram illustrating an example of a display system.

FIG. 15 is a block diagram of a display system 10.

The display system 10 has a function of generating image data by using data received from the outside and a function of displaying a picture on the basis of the image data.

The display system 10 includes a display portion 20 and a signal generation portion 30. The display portion 20 includes a plurality of display panels DP. The structure of the display panel described above in this embodiment can be used for the display panel DP. The signal generation portion 30 has a function of generating image data by using data received from the outside. The display panel DP has a function of displaying a picture on the basis of the image data.

FIG. 15 illustrates an example in which the display portion 20 includes a plurality of display panels DP arranged in a matrix of x rows and y columns (x and y are each an integer greater than or equal to 1). Note that displays of the display panels DP can be controlled independently of each other.

The signal generation portion 30 includes a front end portion 31, a decoder 32, a first processing portion 33, a receiving portion 34, an interface 35, a control portion 36, a second processing portion 40, and a dividing portion 45.

The front end portion 31 has a function of receiving a signal input from the outside and performing signal processing as appropriate. For example, a broadcast signal encoded and modulated by a predetermined method, or the like is input to the front end portion 31. The front end portion 31 can have a function of demodulating a received video signal and an analog-digital conversion function, for example. Furthermore, the front end portion 31 may also have a function of correcting an error. Data received and subjected to signal processing in the front end portion 31 is output to the decoder 32.

The decoder 32 has a function of decoding the encoded signal. In the case where image data contained in a broadcast signal input to the front end portion 31 has been compressed, the data is decompressed by the decoder 32. For example, the decoder 32 can have a function of performing entropy decoding, inverse quantization, inverse orthogonal transform such as inverse discrete cosine transform (IDCT) or inverse discrete sine transform (IDST), intra-frame prediction, and inter-frame prediction.

Note that as a coding standard in an 8K broadcast, H.265/MPEG-H High Efficiency Video Coding (hereinafter referred to as HEVC) is employed. In the case where the image data included in the broadcast signal input to the front end portion 31 is encoded according to HEVC, decoding according to HEVC is performed by the decoder 32. Image data generated by the decoding processing by the decoder 32 is output to the first processing portion 33.

The first processing portion 33 has a function of performing image processing on the image data input from the decoder 32, generating first image data SD1, and outputting it to the second processing portion 40.

Examples of the image processing include noise removal processing, grayscale conversion processing, tone correction processing, and luminance correction processing. The tone correction processing or the luminance correction processing can be performed with the use of gamma correction or the like. Furthermore, the first processing portion 33 may have a function of executing pixel interpolation processing accompanying up-conversion of the resolution, frame interpolation processing accompanying up-conversion of the frame frequency, or the like.

Examples of the noise removal processing include removal of various noise such as mosquito noise that appears near the outlines of characters and the like, block noise that appears in high-speed moving images, random noise that causes flicker, and dot noise caused by up-conversion of the resolution.

The gray level conversion processing is processing in which the gray level of the first image data SD1 is converted into gray level corresponding to output characteristics of the display portion 20. For example, in the case where the number of gray levels is increased, gray levels corresponding to pixels are interpolated to an input image with a small number of gray levels and assigned to the pixels, so that processing for smoothing a histogram can be performed. In addition, high-dynamic range (HDR) processing for increasing a dynamic range is also included in the gray level conversion processing.

The tone correction processing is processing in which the tone of a picture is corrected. The luminance correction processing is processing in which the brightness (luminance contrast) of a picture is corrected. The luminance and tone of a picture displayed on the display portion 20 are corrected to be optimal, in accordance with the kind, luminance, or color purity of lighting of a space in which the display portion 20 is provided, for example.

The pixel interpolation processing is processing in which data that does not actually exist is interpolated when resolution is up-converted. For example, as newly interpolated data of the colors of a pixel (e.g., the gray level values corresponding to the colors, red (R), green (G), and blue (B)), data is interpolated to be data of the color intermediate between the colors of pixels around the pixel with reference to data of the colors of the pixels around the pixel.

In the case where the frame frequency of the displayed picture is increased, the frame interpolation processing is processing in which an image for a frame that does not actually exist (an interpolation frame) is generated. For example, an image for an interpolation frame that is interposed between certain two images is generated from a difference between the two images. Alternatively, images for a plurality of interpolation frames can be generated between the two images. For example, when the frame frequency of image data is 60 Hz, a plurality of interpolation frames are generated, and the frame frequency of a video signal output to the display portion 20 can be increased twofold to 120 Hz, fourfold to 240 Hz, or eightfold to 480 Hz, for example.

Note that it is also possible to perform the above image processing by a processing portion which is provided separately from the first processing portion 33. One or more of the above image processing may be performed by the second processing portion 40.

The receiving portion 34 has a function of receiving data or a control signal input from the outside. The input of the data or the control signal to the receiving portion 34 can be performed with an arithmetic processing device 50, a remote controller, a portable information terminal (e.g., a smartphone or a tablet), an operation button or a touch panel provided on the display portion 20, or the like.

Note that the arithmetic processing device 50 can supply a weight coefficient used in the second processing portion 40 or the like to the display system 10. As the arithmetic processing device 50, a calculator having high arithmetic processing properties, such as a computer, a server, or a cloud, can be used. The arithmetic processing device 50 can supply a weight coefficient obtained by learning to the second processing portion 40 through the receiving portion 34.

The interface 35 has a function of performing, as appropriate, signal processing on the data or the control signal received by the receiving portion 34 and outputting it to the control portion 36.

The control portion 36 has a function of supplying the control signals to the circuits included in the signal generation portion 30. For example, the control portion 36 has a function of supplying the control signals to the decoder 32, the first processing portion 33, and the second processing portion 40. The control by the control portion 36 can be performed on the basis of the control signal received by the receiving portion 34, or the like.

The second processing portion 40 has a function of correcting the first image data SD1 input from the first processing portion 33 and generating second image data SD2. The second image data SD2 generated by the second processing portion 40 is output to the signal line driver circuit included in the display portion 20.

For example, the second processing portion 40 has a function of correcting the first image data SD1 to make display unevenness of the display portion 20 inconspicuous. For example, there might occur display unevenness because of a variation in transistor characteristics or capacitor size in the display panel DP, an effect of the parasitic resistance or parasitic capacitance of signal lines, an in-plane variation in drive capability of the signal line driver circuit, an in-plane variation in display element characteristics, and the like. Even in this case, the second image data SD2 generated by the second processing portion 40 enables a picture with inconspicuous unevenness to be displayed.

Furthermore, the second processing portion 40 has a function of correcting the first image data SD1 to compensate for the picture discontinuity at the boundary between the two display panels DP. The second image data SD2 generated by the second processing portion 40 enables a picture with an inconspicuous seam to be displayed.

The dividing portion 45 has a function of dividing the second image data SD2 input from the second processing portion 40. The second image data SD2 is divided into pieces of data that are the same in number as the display panels DP provided in the display portion 20. In FIG. 15, the second image data SD2 is divided into x×y pieces of data (second image data SD2[1, 1] to SD2[x, y]) and output to the display portion 20. Second image data SD2[p, q] (p is an integer greater than or equal to 1 and less than or equal to x, and q is an integer greater than or equal to 1 and less than or equal to y) is image data corresponding to an image displayed on a display panel DP[p, q]. A control signal is supplied from the control portion 36 to the dividing portion 45.

A video signal supplied from the signal generation portion 30 is input to the display panel DP.

In the display portion 20, there is a region where the display panels DP are adjacent to each other, that is, a seam region between the display panels DP (a region S in the diagram), as illustrated in FIG. 16(A). When a picture is displayed using the plurality of display panels DP, picture continuity in the region S is preferably ensured.

However, there can be variations in the transistor characteristics or capacitor size in the pixels, the parasitic resistance or parasitic capacitance of the signal lines, the drive capability of the signal line driver circuit, and the like among the display panels DP. This can make an error in a picture displayed on each display panel DP when the video signals are supplied to the display panels DP, which might result in picture discontinuity in the seam region. Furthermore, in the case where the display region 71 of one display panel DP includes a region overlapping with the visible-light-transmitting region 72 of another display panel DP, in the seam region, the picture displayed in the display region 71 is viewed through the visible-light-transmitting region 72 and a gray level error can occur. Thus, if pieces of data (first image data SD1[1, 1] to SD1[x, y]) obtained by directly dividing the first image data SD1 generated by the first processing portion 33 are supplied to the display panels DP, a picture that is discontinuous in the region S can be viewed as illustrated in FIG. 16(B-1).

Here, the display system of one embodiment of the present invention includes the second processing portion 40 having a function of correcting a video signal by utilizing artificial intelligence. Specifically, the second processing portion 40 can correct the video signal to relieve the picture discontinuity at a seam between two display panels DP. In this manner, in the case where the display portion 20 is formed using the plurality of display panels DP, the picture distortion at the seam between the display panels DP can be made inconspicuous, improving the quality of the picture.

The second processing portion 40 illustrated in FIG. 15 has a function of correcting the video signal input from the first processing portion 33. Specifically, the second processing portion 40 has a function of correcting the first image data SD1 so that a picture which is continuous at a boundary between two display panels DP is displayed, that is, the picture discontinuity at the seam is compensated for.

The correction of the first image data SD1 is performed by the second processing portion 40. In the second processing portion 40, learning is performed to appropriately correct a video signal so that picture discontinuity in a seam region is relieved. Then, when the first image data SD1 is supplied to the second processing portion 40, the second processing portion 40 performs inference and outputs the second image data SD2. Then, when the second image data SD2 generated by the second processing portion 40 is divided into x×y pieces of data by the dividing portion 45 and the second image data SD2[p, q] is supplied to the display panel DP[p, q], a picture with an inconspicuous seam is displayed as illustrated in FIG. 16(B-2).

Specifically, processing for making the seam region brighter than other regions can be performed. As a result, a natural picture having a sense of unity, in which the seam is not easily recognized, can be displayed over the plurality of display panels DP. Furthermore, since display unevenness can be corrected at the same time, display quality of the display portion can be further improved.

Structure Example of Transistor

Next, transistors that can be used in the display panel or the display device will be described.

The structures of the transistors in the display panel or the display device are not particularly limited. For example, a planar transistor may be used, a staggered transistor may be used, or an inverted staggered transistor may be used. The transistor structure may be either a top-gate structure or a bottom-gate structure. Alternatively, gate electrodes may be provided above and below a channel.

FIG. 17 illustrates structure examples of transistors. Each transistor is provided between an insulating layer 141 and an insulating layer 208. The insulating layer 141 preferably has a function of a base film. The insulating layer 208 preferably has a function of a planarization film.

The transistors 210a and 210b illustrated in FIGS. 17(A1) and 17(A2) are each a top-gate transistor including a metal oxide in a semiconductor layer. The metal oxide can function as an oxide semiconductor.

An oxide semiconductor is preferably used as the semiconductor of the transistor. Using a semiconductor material having a wider band gap and a lower carrier density than silicon is preferable because the off-state current of a transistor can be reduced.

The transistors 210a and 210b each include a conductive layer 201, an insulating layer 202, a conductive layer 203a, a conductive layer 203b, a semiconductor layer, a conductive layer 205, and an insulating layer 207. The transistor 210a further includes an insulating layer 206a, and the transistor 210b further includes an insulating layer 206b. The conductive layer 201 functions as a gate. The conductive layer 205 functions as a back gate. The insulating layer 202, the insulating layer 206a, and the insulating layer 206b function as gate insulating layers. The semiconductor layer includes a channel formation region 204a and a pair of low-resistance regions 204b. The channel formation region 204a overlaps with the conductive layer 205 with the insulating layer 206a or the insulating layer 206b therebetween. The channel formation region 204a overlaps with the conductive layer 201 with the insulating layer 202 therebetween. The conductive layer 203a is electrically connected to one of the pair of low-resistance regions 204b through an opening provided in the insulating layer 207. In a similar manner, the conductive layer 203b is electrically connected to the other of the pair of low-resistance regions 204b. Any of a variety of inorganic insulating films can be used as the insulating layer 202, the insulating layer 206a, the insulating layer 206b, and the insulating layer 207. In particular, an oxide insulating film is suitable for the insulating films which are included in the insulating layer 202, the insulating layer 206a, and the insulating layer 206b and are in contact with the channel formation region 204a, and a nitride insulating film is suitable for the insulating layer 207.

The thickness of the insulating layer 206b functioning as a gate insulating layer of the transistor 210b is smaller than the thickness of the insulating layer 206a functioning as a gate insulating layer of the transistor 210a. A channel length Lb of the transistor 210b is shorter than a channel length La of the transistor 210a. Therefore, the driving frequency of the transistor 210b can be higher than that of the transistor 210a, and the withstand voltage of the transistor 210a can be higher than that of the transistor 210b. Accordingly, it is preferable that, in the display panel, the transistor 210a be used as a transistor in the display region and the transistor 210b be used as a transistor in the driver circuit.

Note that the display panel may be manufactured using only one of the transistors 210a and 210b. Alternatively, the display panel may be manufactured by combining one of the transistors 210a and 210b and another transistor.

The structure in which the semiconductor layer where a channel is formed is sandwiched between the two gates is used for the transistors 210a and 210b. The two gates are preferably connected to each other and supplied with the same signal so that the transistor operates. Such a transistor can have a higher field-effect mobility and thus have a higher on-state current than other transistors. Consequently, a circuit capable of high-speed operation can be manufactured. Furthermore, the area occupied by a circuit portion can be reduced. The use of the transistor having a high on-state current can reduce signal delay in wirings and can reduce display unevenness even in a display panel or a display device in which the number of wirings is increased because of increase in size or definition. Alternatively, by supplying a potential for controlling the threshold voltage to one of the two gates and a potential for driving to the other, the threshold voltage of the transistor can be controlled.

A metal oxide film that functions as a semiconductor layer can be deposited using one or both of an inert gas and an oxygen gas. Note that there is no particular limitation on the flow rate ratio of oxygen (the partial pressure of oxygen) at the time of depositing the metal oxide film. However, to obtain a transistor having a high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide preferably contains at least indium or zinc. In particular, indium and zinc are preferably contained. The metal oxide will be described in detail in Embodiment 3.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

A transistor 220 illustrated in FIG. 17(B) is a bottom-gate transistor including a metal oxide in a semiconductor layer 204.

The transistor 220 includes the conductive layer 201, the insulating layer 202, the conductive layer 203a, the conductive layer 203b, and the semiconductor layer 204. The conductive layer 201 functions as a gate. The insulating layer 202 functions as a gate insulating layer. The semiconductor layer 204 overlaps with the conductive layer 201 with the insulating layer 202 therebetween. The conductive layer 203a and the conductive layer 203b are each electrically connected to the semiconductor layer 204. The transistor 220 is preferably covered with an insulating layer 211 and an insulating layer 212. Any of a variety of inorganic insulating films can be used as the insulating layer 211 and the insulating layer 212. In particular, an oxide insulating film is suitable for the insulating layer 211, and a nitride insulating film is suitable for the insulating layer 212.

A transistor 230 illustrated in FIG. 17(C) is a top-gate transistor including low-temperature polysilicon (LTPS) in a semiconductor layer.

The transistor 230 includes the conductive layer 201, the insulating layer 202, the conductive layer 203a, the conductive layer 203b, a semiconductor layer, and an insulating layer 213. The conductive layer 201 functions as a gate. The insulating layer 202 functions as a gate insulating layer. The semiconductor layer includes a channel formation region 214a and a pair of low-resistance regions 214b. The semiconductor layer may further include an LDD (Lightly Doped Drain) region. FIG. 17(C) shows an example in which an LDD region 214c is provided between the channel formation region 214a and the low-resistance region 214b. The channel formation region 214a overlaps with the conductive layer 201 with the insulating layer 202 therebetween. The conductive layer 203a is electrically connected to one of the pair of low-resistance regions 214b through an opening provided in the insulating layer 202 and the insulating layer 213. In a similar manner, the conductive layer 203b is electrically connected to the other of the pair of low-resistance regions 214b. Any of a variety of inorganic insulating films can be used as the insulating layer 213. In particular, a nitride insulating film is suitable for the insulating layer 213.

A transistor 240 illustrated in FIG. 17(D) is a bottom-gate transistor including hydrogenated amorphous silicon in a semiconductor layer 224.

The transistor 240 includes the conductive layer 201, the insulating layer 202, the conductive layer 203a, the conductive layer 203b, an impurity semiconductor layer 225, and the semiconductor layer 224. The conductive layer 201 functions as a gate. The insulating layer 202 functions as a gate insulating layer. The semiconductor layer 224 overlaps with the conductive layer 201 with the insulating layer 202 therebetween. The conductive layer 203a and the conductive layer 203b are electrically connected to the semiconductor layer 224 through the impurity semiconductor layer 225. The transistor 240 is preferably covered with an insulating layer 226. Any of a variety of inorganic insulating films can be used as the insulating layer 226. In particular, a nitride insulating film is suitable for the insulating layer 226.

As described above, the display panel of this embodiment has a structure in which formation of a conductive film with low visible-light-transmitting property in a visible-light-transmitting region, which might be caused by bending of a metal mask, is not easily caused at the time of forming a common electrode. Therefore, with the use of the display panels of this embodiment, a display device with an inconspicuous seam between two display panels and high display quality can be provided.

This embodiment can be combined with the other embodiments as appropriate. In this specification, in the case where a plurality of structure examples are shown in one embodiment, the structure examples can be combined as appropriate.

Embodiment 2

Described in this embodiment is a metal oxide applicable to a transistor disclosed in one embodiment of the present invention. In particular, details about a metal oxide and a CAC (Cloud-Aligned Composite)-OS are described below.

A CAC-OS or a CAC-metal oxide has a conducting function in a part of the material and has an insulating function in a part of the material; as a whole, the CAC-OS or the CAC-metal oxide has a function of a semiconductor. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, a high on-state current and a high field-effect mobility.

In other words, the CAC-OS or the CAC-metal oxide can also be called a matrix composite or a metal matrix composite.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that a metal oxide preferably contains at least indium. It is particularly preferable that a metal oxide contain indium and zinc. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The above crystalline compound has a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the flow rate ratio of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, a high field-effect mobility (μ) can be achieved.

In contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility (μ) can be achieved.

Moreover, a semiconductor element using the CAC-OS has high reliability. Thus, the CAC-OS is the most suitable for a variety of semiconductor devices such as displays.

This embodiment can be combined with the other embodiments as appropriate.

Embodiment 3

In this embodiment, electronic devices of embodiments of the present invention will be described with reference to FIG. 18.

An electronic device in this embodiment is provided with the display device of one embodiment of the present invention. Thus, a display portion of the electronic device can display a high-quality picture.

The display portion of the electronic device in this embodiment can display a picture with a resolution of, for example, full high definition, 2K, 4K, 8K, 16K, or higher. In addition, as a screen size of the display portion, the diagonal size can be greater than or equal to 20 inches, greater than or equal to 30 inches, greater than or equal to 50 inches, greater than or equal to 60 inches, or greater than or equal to 70 inches.

Examples of the electronic device include a digital camera, a digital video camera, a digital photo frame, a mobile phone, a portable game console, a portable information terminal, and an audio reproducing device in addition to electronic devices provided with a comparatively large screen, such as a television device, a desktop or laptop personal computer, a monitor for a computer and the like, digital signage, and a large game machine such as a pachinko machine.

The electronic device of one embodiment of the present invention may include an antenna. When a signal is received by the antenna, the electronic device can display a picture, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 18A:
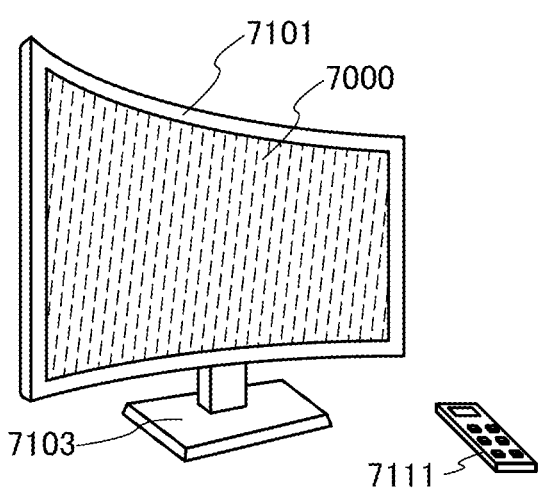
FIGS. 18A to 18D Diagrams illustrating examples of electronic devices.

FIG. 18(A) illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 18(A) can be performed with an operation switch provided in the housing 7101 or a separate remote controller 7111.

Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and pictures displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 18B:
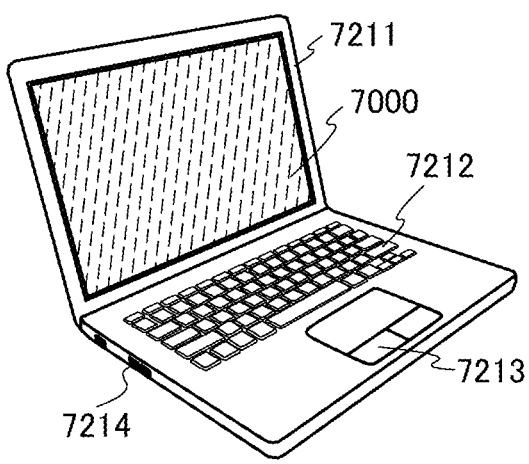

FIG. 18(B) illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 18C:
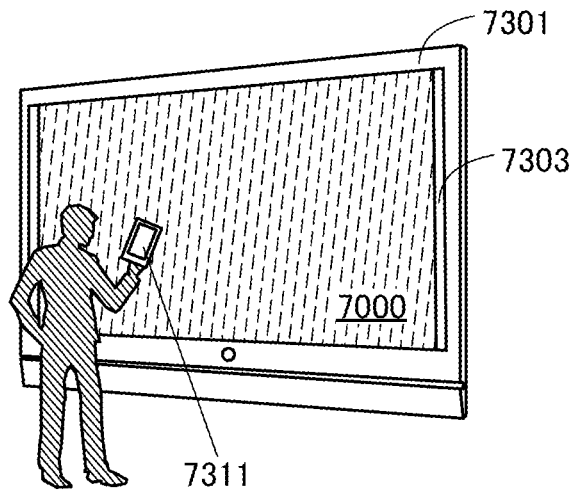
Figure 18D:
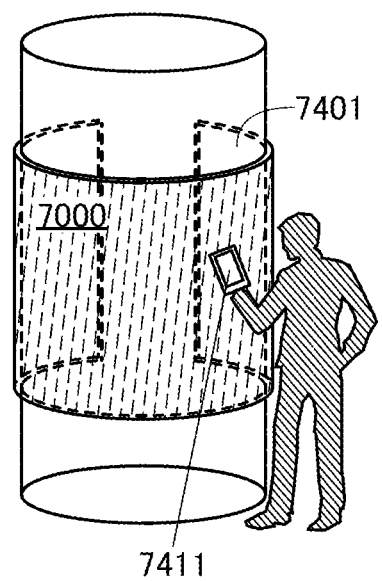

FIGS. 18(C) and 18(D) illustrate examples of digital signage.

Digital signage 7300 illustrated in FIG. 18(C) includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 18(D) is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIGS. 18(C) and 18(D).

A larger area of the display portion 7000 can provide more data at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

Furthermore, as illustrated in FIGS. 18(C) and 18(D), it is preferable that the digital signage 7300 or the digital signage 7400 work with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

This embodiment can be combined with the other embodiments as appropriate.

REFERENCE NUMERALS

DP1: display panel, DP2: display panel, 10: display system, 20: display portion, 30: signal generation portion, 31: front end portion, 32: decoder, 33: first processing portion, 34: receiving portion, 35: interface, 36: control portion, 40: second processing portion, 45: dividing portion, 50: arithmetic processing device, 71: display region, 71a: display region, 71b: display region, 72: visible-light-transmitting region, 72a: visible-light-transmitting region, 73: visible-light-blocking region, 74: FPC, 78: driver circuit, 78b: driver circuit, 101: substrate, 103: insulating layer, 104: insulating layer, 105: protective layer, 110: light-emitting element, 110a: light-emitting element, 110b: light-emitting element, 110b1: portion, 110b2: portion, 111: pixel electrode, 112: EL layer, 113a: common electrode, 113b: common electrode, 114: optical adjustment layer, 118: partition wall, 123: region, 124: region, 131A: coloring layer, 131B: coloring layer, 141: insulating layer, 201: conductive layer, 201a: conductive layer, 202: insulating layer, 203a: conductive layer, 203b: conductive layer, 203s: conductive layer, 203t: conductive layer, 204: semiconductor layer, 204a: channel formation region, 204b: low-resistance region, 205: conductive layer, 206a: insulating layer, 206b: insulating layer, 207: insulating layer, 208: insulating layer, 210a: transistor, 210b: transistor, 211: insulating layer, 212: insulating layer, 213: insulating layer, 214a: channel formation region, 214b: low-resistance region, 214c: LDD region, 220: transistor, 224: semiconductor layer, 225: impurity semiconductor layer, 226: insulating layer, 230: transistor, 240: transistor, 257: wiring, 301: transistor, 303: transistor, 306: connection portion, 307: conductive layer, 308: opening, 311: gate insulating layer, 312: insulating layer, 313: insulating layer, 314: insulating layer, 315: insulating layer, 317: bonding layer, 318: light-transmitting layer, 319: connector, 355: conductive layer, 358: conductive layer, 361: substrate, 363: bonding layer, 365: insulating layer, 367: insulating layer, 370A: display panel, 370B: display panel, 370C: display panel, 370D: display panel, 370E: display panel, 370F: display panel, 370G: display panel, 371: substrate, 387: region, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal.

The invention claimed is:

1. A display panel comprising:
a display region; and
a visible-light-transmitting region,
wherein the display region is adjacent to the visible-light-transmitting region,
wherein the display region comprises an insulating layer, a partition wall, and a light-emitting element,
wherein the light-emitting element comprises a pixel electrode and a common electrode,
wherein the insulating layer comprises an opening,
wherein the insulating layer covers an end portion of the pixel electrode,
wherein the common electrode overlaps with the pixel electrode with the opening therebetween,
wherein the partition wall is positioned over the insulating layer, wherein the partition wall is positioned between the light-emitting element and the visible-light-transmitting region, wherein the partition wall is provided along the visible-light-transmitting region, and wherein a level of a top surface of the partition wall is higher than a level of a top surface of a portion of the common electrode that overlaps with the opening.

2. The display panel according to claim 1, wherein the visible-light-transmitting region and the partition wall are provided along two consecutive sides of the display region.

3. The display panel according to claim 1, further comprising a protective layer over the light-emitting element.

4. A display device comprising:
a first display panel; and
a second display panel,
wherein the first display panel comprises a first display region and a visible-light-transmitting region,
wherein the second display panel comprises a second display region,
wherein the first display region is adjacent to the visible-light-transmitting region,
wherein the first display region comprises an insulating layer, a partition wall, and a light-emitting element,
wherein the light-emitting element comprises a pixel electrode and a common electrode,
wherein the insulating layer comprises an opening,
wherein the insulating layer covers an end portion of the pixel electrode,
wherein the common electrode overlaps with the pixel electrode with the opening therebetween,
wherein the partition wall is positioned over the insulating layer,
wherein the partition wall is positioned between the light-emitting element and the visible-light-transmitting region,
wherein the partition wall is provided along the visible-light-transmitting region,
wherein a level of a top surface of the partition wall is higher than a level of a top surface of a portion of the common electrode that overlaps with the opening, and
wherein the second display region comprises a portion overlapping with the visible-light-transmitting region.

5. The display device according to claim 4, wherein the visible-light-transmitting region and the partition wall are provided along two consecutive sides of the first display region.

6. The display device according to claim 4, further comprising a protective layer over the light-emitting element.

* * * * *